United States Patent
Sakano

(10) Patent No.: US 11,075,237 B2
(45) Date of Patent: Jul. 27, 2021

(54) SOLID-STATE IMAGE SENSOR, SIGNAL PROCESSING METHOD AND ELECTRONIC APPARATUS

(71) Applicant: Sony Corporation, Tokyo (JP)

(72) Inventor: Yorito Sakano, Kanagawa (JP)

(73) Assignee: Sony Corporation, Tokyo (JP)

( * ) Notice: Subject to any disclaimer, the term of this patent is extended or adjusted under 35 U.S.C. 154(b) by 679 days.

(21) Appl. No.: 15/135,749

(22) Filed: Apr. 22, 2016

(65) Prior Publication Data

US 2016/0260757 A1   Sep. 8, 2016

Related U.S. Application Data

(63) Continuation of application No. 13/734,145, filed on Jan. 4, 2013, now abandoned.

(30) Foreign Application Priority Data

Jan. 23, 2012   (JP) .............................. JP2012-010806

(51) Int. Cl.
*H01L 27/146* (2006.01)
*H04N 5/335* (2011.01)
(Continued)

(52) U.S. Cl.
CPC .. *H01L 27/14612* (2013.01); *H01L 27/14636* (2013.01); *H01L 27/14643* (2013.01);
(Continued)

(58) Field of Classification Search
CPC .... H04N 5/3575; H04N 5/359; H04N 5/3595; H04N 5/3651; H04N 5/3653; H04N 5/3655; H04N 5/3696
See application file for complete search history.

(56) References Cited

U.S. PATENT DOCUMENTS 6,433,373 B1 * 8/2002 Lee ................... H01L 27/14603
257/233
7,745,860 B2 * 6/2010 Inoue ................ H01L 27/14603
257/292
(Continued)

FOREIGN PATENT DOCUMENTS

CN          189763 A    1/2007
CN       101964877 A    2/2011
(Continued)

OTHER PUBLICATIONS

Japanese Office Action dated Jan. 28, 2016 for corresponding Japanese Application No. 2012-010806.
(Continued)

*Primary Examiner* — Daniel M Pasiewicz
(74) *Attorney, Agent, or Firm* — Michael Best & Friedrich LLP

(57) ABSTRACT

There is provided a solid-state image sensor including pixels each at least including light receiving parts receiving light to generate charge, a transfer part transferring the charge accumulated in the light receiving parts, and memory parts holding the charge transferred via the transfer part, and a predetermined number of elements shared by the plurality of pixels, the predetermined number of elements being for outputting a pixel signal at a level corresponding to the charge, wherein one or some of the plurality of pixels is/are a correction pixel(s) outputting a correction pixel signal used for correcting a pixel signal outputted from pixels other than the one or some of the plurality of pixels, and one or some of the predetermined number of elements is/are formed on a wiring layer side of the light receiving parts included in the correction pixel(s).

19 Claims, 15 Drawing Sheets

(51) Int. Cl.
*H04N 5/3745* (2011.01)
*H04N 5/359* (2011.01)

(52) U.S. Cl.
CPC ............. *H04N 5/335* (2013.01); *H04N 5/359* (2013.01); *H04N 5/37452* (2013.01); *H04N 5/37457* (2013.01)

(56) References Cited

U.S. PATENT DOCUMENTS

| | | | | |
|---|---|---|---|---|
| 8,101,978 B2* | 1/2012 | Dai | ................... | H01L 27/14603 257/228 |
| 8,115,242 B2* | 2/2012 | Merrill | .............. | H01L 27/14647 257/219 |
| 2003/0096443 A1* | 5/2003 | Hwang | ............. | H01L 27/14603 438/59 |
| 2006/0208285 A1* | 9/2006 | Inoue | ................ | H01L 27/14603 257/239 |
| 2007/0013798 A1 | 1/2007 | Ahn et al. | | |
| 2007/0069258 A1* | 3/2007 | Ahn | ................... | H01L 27/14634 257/290 |
| 2007/0246756 A1* | 10/2007 | Mouli | .............. | H01L 27/14603 257/292 |
| 2008/0001192 A1* | 1/2008 | Inoue | ................ | H01L 27/14603 257/291 |
| 2008/0170149 A1* | 7/2008 | Iida | ................... | H01L 27/14603 348/315 |
| 2009/0236644 A1 | 9/2009 | Adkisson et al. | | |
| 2010/0045836 A1* | 2/2010 | Lee | ................... | H01L 27/14603 348/308 |
| 2011/0019038 A1 | 1/2011 | Okuno | | |
| 2011/0139963 A1 | 6/2011 | Krymski | | |
| 2011/0234836 A1 | 9/2011 | Machida | | |
| 2012/0081588 A1 | 4/2012 | Adkisson et al. | | |
| 2012/0249817 A1 | 10/2012 | Ishii | | |

FOREIGN PATENT DOCUMENTS

| | | |
|---|---|---|
| JP | 09-247536 | 9/1997 |
| JP | 10-070261 | 3/1998 |
| JP | 3759435 | 1/2006 |
| JP | 2007-150008 A | 6/2007 |
| JP | 2008-028516 | 7/2008 |
| JP | 2008-172580 A | 7/2008 |
| JP | 2009-049870 | 3/2009 |
| JP | 2011-029835 | 2/2011 |
| JP | 2011-188410 A | 9/2011 |

OTHER PUBLICATIONS

Chinese Office Action dated Feb. 6, 2017 for corresponding Chinese Application No. 201310016248.2.

* cited by examiner

FIG. 2A

| Gr | R | Gr | R |
|---|---|---|---|
| B | Gb | B | Gb |
| Gr | R | Gr | R |
| B | Gb | B | Gb |

| G | R | G | R |
|---|---|---|---|
| B | X | B | X |
| G | R | G | R |
| B | X | B | X |

21G, 21R, 21B, 21X

SOLID-STATE IMAGE SENSOR, SIGNAL PROCESSING METHOD AND ELECTRONIC APPARATUS

CROSS REFERENCE TO RELATED APPLICATION

This is a Continuation application of application Ser. No. 13/734,145, filed Jan. 4, 2013, which in turn claims priority from Japanese Application No.: 2012-010806, filed on Jan. 23, 2012, the entire contents of which are incorporated herein by reference.

BACKGROUND

The present disclosure relates to a solid-state image sensor, a signal processing method and an electronic apparatus, and specifically, relates to a solid-state image sensor, a signal processing method and an electronic apparatus capable of acquiring more excellent pixel signals.

Typically, existing image sensors which read out charges accumulated in light receiving parts via MOS (Metal Oxide Semiconductor) transistors perform readout operation for each pixel or for each row or the like. Therefore, since an exposure period for accumulating photocharges is not able to be made coincident among all of the pixels, there sometimes arises distortion in imaging in case of the subject moving or the like.

On the contrary, an image sensor disclosed in Japanese Patent Application Publication No. H11-177076 is provided with charge retention parts in pixels in addition to light receiving parts, transfers charges accumulated in the light receiving parts to the charge retention parts collectively for all of the pixels, and thereby, enables to hold the signal charges until readout operation for each row. This enables imaging operation due to collective exposure of all of the pixels. Moreover, in this image sensor, portions except the light receiving parts are shielded from light by metal wirings, specifically, aluminum (Al).

Moreover, Japanese Patent Application Publication No. H09-247536 also discloses an image sensor which enables imaging operation due to collective exposure of all of the pixels similarly to Japanese Patent Application Publication No. H11-177076 and employs a configuration in which a charge accumulation diode does not detect light from the outside by covering its upper portion with a shielding layer. Similarly, Japanese Patent Application Publication No. H10-070261 also discloses an image sensor having a storing region shielded by light shielding.

Like this, image sensors enabling imaging operation due to collective exposure of all of the pixels employ a structure of light shielding such that light does not leaks into charge retention parts during transferring charges accumulated in light receiving parts to the charge retention parts collectively for all of the pixels and holding the signal charges until readout operation for each row. Thereby, deterioration of image quality caused by leakage charges arising from, while the charge retention parts hold the signal charges, light leaking thereinto can be suppressed.

Furthermore, in Japanese Patent Application Publication No. 2011-29835, the Applicant proposes an image sensor in which correction pixels are arranged for correcting deterioration of image quality caused by leakage charges.

On the other hand, as disclosed in Japanese Patent No. 3759435, a back-illuminated image sensor is proposed which is improved in sensitivity especially for relatively fine pixels by a photoelectric conversion part receiving light entering a backside opposite to a surface on which circuit elements, wirings and the like are provided in a semiconductor substrate. The back-illuminated image sensor is tending to technology of importance recent years.

Similarly to the existing image sensors as described above, also in such a back-illuminated image sensor, since readout operation is performed for each pixel or for each row or the like, and thereby, an exposure period for accumulating photocharges is not able to be made coincident among all of the pixels, there sometimes arises distortion in imaging in case of the subject moving or the like.

SUMMARY

Incidentally, the image sensors enabling imaging operation due to collective exposure of all of the pixels, which sensors are disclosed in Patent Literatures 1 to 3, are expected to be shielded from light such that the light does not leak into the charge retention parts, whereas completely shielding the light is difficult for any light shielding structure. Moreover, Japanese Patent Application Publication No. 2011-29835 proposes the arrangement of the correction pixels for correcting deterioration of image quality caused by the leakage charges, whereas it is supposed that only providing the correction pixels simply within the pixel region unavoidably leads to decrease of resolution and decrease of area efficiency.

On the other hand, it is further more difficult for the back-illuminated image sensor disclosed in Japanese Patent No. 3759435 to enable imaging operation due to collective exposure of all of the pixels. In the back-illuminated image sensor, light enters the backside opposite to the surface on which circuit elements, wirings and the like are provided in the semiconductor substrate. Therefore, in view of the process, it is significantly difficult to shield the charge retention parts from light such that the light does not leak thereinto. Accordingly, although it is still important to provide correction pixels for this reason, only providing the correction pixels simply within the pixel region just leads to significant deterioration of characteristics compared with image sensors without correction pixels, because, in the first place, the back-illuminated image sensor is a technology for compensating for decrease in sensitivity arising from downsizing of pixels.

Accordingly, a technology is desired capable of acquiring more excellent pixel signals by preventing reduction of the areas of light receiving parts in size in case of correction pixels provided for correcting deterioration of image quality caused by leakage charges to suppress decrease of pixels in sensitivity.

The present disclosure is devised in view of the aforementioned circumstances, and it is desirable to provide acquiring more excellent pixel signals.

According to an embodiment of the present disclosure, there is provided a solid-state image sensor including pixels each at least including light receiving parts receiving light to generate charge, a transfer part transferring the charge accumulated in the light receiving parts, and memory parts holding the charge transferred via the transfer part, and a predetermined number of elements shared by the plurality of pixels, the predetermined number of elements being for outputting a pixel signal at a level corresponding to the charge, wherein one or some of the plurality of pixels is/are a correction pixel(s) outputting a correction pixel signal used for correcting a pixel signal outputted from pixels other than the one or some of the plurality of pixels, and the one or some of the predetermined number of elements is/are formed on the light receiving parts included in the correction pixel(s).

According to an embodiment of the present disclosure, there is provided a signal processing method for a solid-state image sensor including, the solid-state image sensor including pixels each at least including light receiving parts receiving light to generate charge, a transfer part transferring the charge accumulated in the light receiving parts, and memory parts holding the charge transferred via the transfer part, and a predetermined number of elements shared by the plurality of pixels, the predetermined number of elements being for outputting a pixel signal at a level corresponding to the charge, wherein one or some of the plurality of pixels is/are a correction pixel(s) outputting a correction pixel signal used for correcting a pixel signal outputted from pixels other than the one or some of the plurality of pixels, and the one or some of the predetermined number of elements is/are formed on the light receiving parts included in the correction pixel(s), the method including subtracting the pixel signal outputted from the correction pixel(s) from the pixel signal outputted from a normal pixel other than the correction pixel(s).

According to an embodiment of the present disclosure, there is provided an electronic apparatus including a solid-state image sensor including pixels each at least including light receiving parts receiving light to generate charge, a transfer part transferring the charge accumulated in the light receiving parts, and memory parts holding the charge transferred via the transfer part, and a predetermined number of elements shared by the plurality of pixels, for the predetermined number of elements being for outputting a pixel signal at a level corresponding to the charge, wherein one or some of the plurality of pixels is/are a correction pixel(s) outputting a correction pixel signal used for correcting a pixel signal outputted from pixels other than the one or some of the plurality of pixels, and the one or some of the predetermined number of elements is/are formed on the light receiving parts included in the correction pixel(s).

According to one embodiment of the present disclosure, a part of a predetermined number of elements shared by a plurality of pixels is formed in a light receiving part included in a correction pixel which is a part of the plurality of pixels.

According to one embodiment of the present disclosure, more excellent pixel signals can be acquired.

BRIEF DESCRIPTION OF THE DRAWINGS

FIGS. 2A and 2B are diagrams illustrating a planar layout of a pixel array having correction pixels;

DETAILED DESCRIPTION OF THE EMBODIMENT(S)

Figure 1:
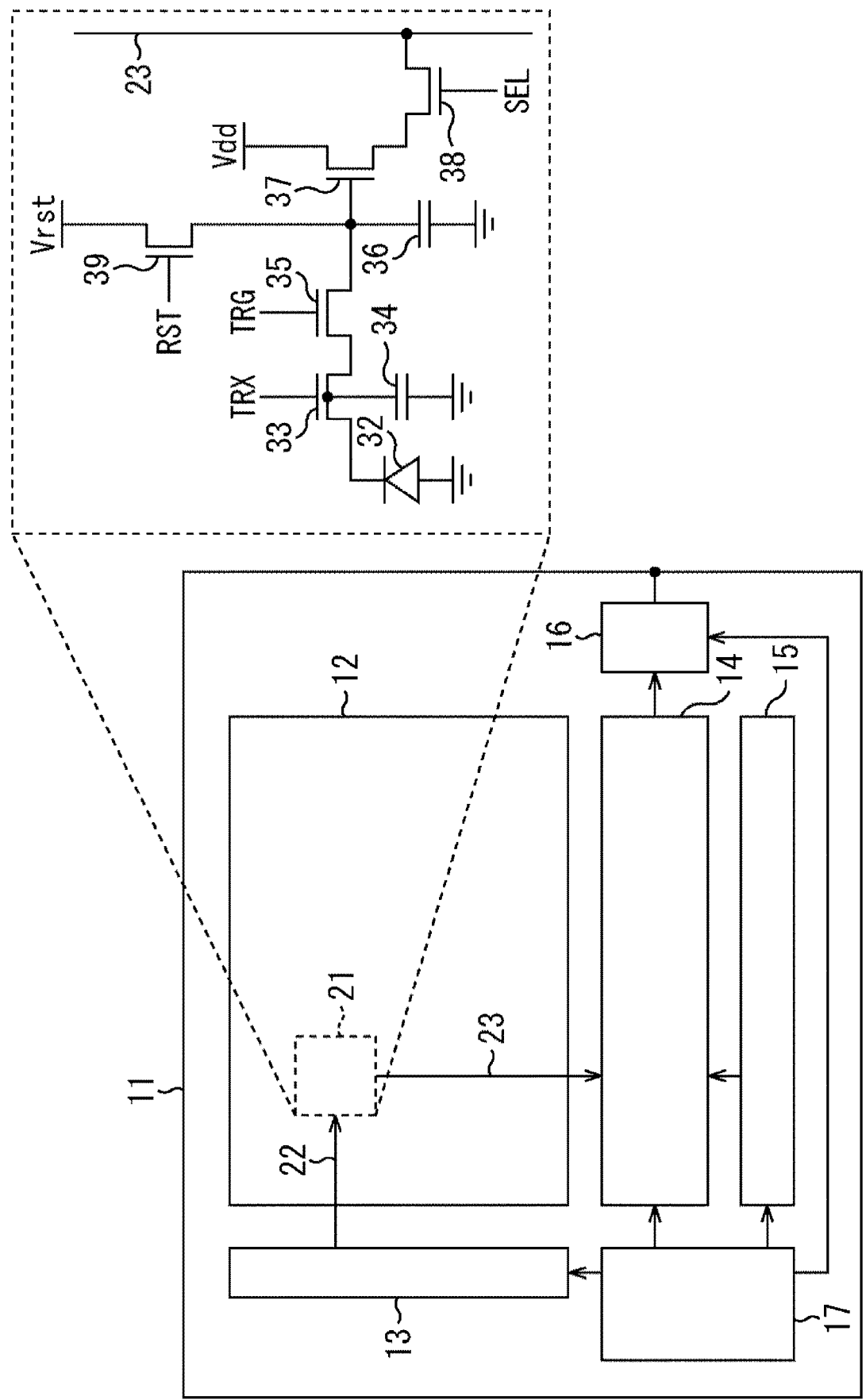
FIG. 1 is a block diagram illustrating an exemplary configuration of one embodiment of an image sensor to which the present technology is applied.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

FIG. 1 is a block diagram illustrating an exemplary configuration of one embodiment of an image sensor to which the present technology is applied.

An image sensor 11 in FIG. 1 is a CMOS (Complementary Metal Oxide Semiconductor) solid-state image sensor, and is configured to include a pixel array 12, a vertical driver 13, a column processing section 14, a horizontal driver 15, an output section 16 and a drive controller 17.

The pixel array 12 has a plurality of pixels 21 arranged into an array shape. Incidentally, an exemplary configuration of a pixel 21 enlarged and presented at the right top in FIG. 1 represents a basic configuration having a charge retention part for facilitating imaging operation due to the collective exposure of all pixels as mentioned above (configuration not employing any shared pixel structure). However, the image sensor 11 employs a shared pixel structure constituted of pixels 21-1 to 21-3 outputting pixel signals at levels corresponding to charges generated by photoelectric conversion and a correction pixel 21X outputting a correction pixel signal used for correction of the pixel signals outputted from the pixels 21-1 to 21-3 as mentioned later with reference to FIG. 3.

In the pixel array 12, the pixel 21 is connected to the vertical driver 13 via a plurality of horizontal signal lines 22 corresponding to the number of rows of the pixels 21, and connected to the column processing section 14 via a plurality of vertical signal lines 23 corresponding to the number of columns of the pixels 21. Namely, the plurality of pixels 21 included in the pixel array 12 are arranged at individual points at which the horizontal signal lines 22 cross the vertical signal lines 23.

The vertical driver 13 sequentially supplies drive signals for driving each pixel 21 (transfer signal, selection signal, reset signal and the like) via the horizontal signal line 22 for each row of the plurality of pixels 21 included in the pixel array 12.

The column processing section 14 extracts a signal level of a pixel signal by performing CDS (Correlated Double Sampling) processing on the pixel signal outputted from each pixel 21 via the vertical signal line 23, and acquires a pixel signal corresponding to the amount of light received by the pixel 21. In the CDS processing, the pixel signal in which the noise component inherent to the pixel 21 is removed is outputted by calculating a difference between a pixel signal at a reset level and the pixel signal at the level corresponding to the amount of light received by the pixel 21.

The horizontal driver 15 sequentially supplies drive signals for causing the column processing section 14 to sequentially output the pixel signals acquired from the respective pixels 21, to the column processing section 14 for each column of the plurality of pixels 21 included in the pixel array 12.

To the output section 16, the pixel signals are supplied from the column processing section 14 at time points corresponding to the respective drive signals from the horizontal driver 15. The output section 16 amplifies the pixel signals, for example, to output them to a downstream signal processing circuit (for example, a signal processing circuit 104 in FIG. 15).

The drive controller 17 controls driving of the individual blocks inside the image sensor 11. For example, the drive controller 17 generates clock signals according to driving intervals for the individual blocks to supply them to the respective blocks.

Moreover, as illustrated at the right top in FIG. 1, the pixel 21 is configured to include a light receiving part 32, a first transfer transistor 33, a memory part 34, a second transfer transistor 35, an FD (Floating Diffusion) 36, an amplification transistor 37, a selection transistor 38 and a reset transistor 39. In addition, as mentioned above, the image sensor 11 employs a shared pixel structure constituted of pixels 21-1 to 21-3 and a correction pixel 21X, whereas the pixel 21 is herein described which is a basic configuration having the memory part 34 as a charge retention part.

The light receiving part 32 is a photoelectric conversion part constituted of a PD (Photodiode), for example, and generates and accumulates charge corresponding to the amount of light received to accumulate it.

The first transfer transistor 33 is driven according to a transfer signal TRX supplied from the vertical driver 13 via the horizontal signal line 22, and when the first transfer transistor 33 is turned on, the charge accumulated in the light receiving part 32 is transferred to the memory part 34.

The memory part 34 holds the charge transferred from the light receiving part 32 via the first transfer transistor 33.

The second transfer transistor 35 is driven according to a transfer signal TRG supplied from the vertical driver 13 via the horizontal signal line 22, and when the second transfer transistor 35 is turned on, the charge accumulated in the memory part 34 is transferred to the FD 36.

The FD 36 is a floating diffusion region which has a predetermined capacity and is formed in the portion in which the second transfer transistor 35 and the gate electrode of the amplification transistor 37 are connected, and accumulates the charge transferred from the memory part 34 via the second transfer transistor 35.

The amplification transistor 37 is connected to a power supply potential Vdd, amplifies the charge accumulated in the FD 36, and outputs a pixel signal at the level corresponding to the charge to the vertical signal line 23 via the selection transistor 38.

The selection transistor 38 is driven according to a selection signal SEL supplied from the vertical driver 13 via the horizontal signal line 22, and when the selection transistor 38 is turned on, the pixel signal outputted from the amplification transistor 37 is ready to be outputted to the vertical signal line 23.

The reset transistor 39 is driven according to a reset signal RST supplied from the vertical driver 13 via the horizontal signal line 22, and when the reset transistor 39 is turned on, the charge accumulated in the FD 36 is discharged to a reset potential Vrst and the FD 36 is reset. Moreover, at this stage, turning on the first transfer transistor 33 and second transfer transistor 35 simultaneously also resets the charges accumulated in the light receiving part 32 and memory part 34.

The image sensor 11 is configured as above, and simultaneously in all of the pixels 21 included in the pixel array 12, charges are transferred from light receiving parts 32 to memory parts 34. After that, the charges held in the memory parts 34 are transferred to FDs 36 for each row of the pixels 21, and pixel signals at the levels corresponding to the charges are read out via the vertical signal line 23.

Herein, the image sensor 11 employs a light shielding structure in which, while the light receiving part 32 receives light, the memory part 34 is shielded from light such that no light is incident on the memory part 34. However, there is still a chance that light entering the image sensor 11 in an oblique direction leaks into the memory part 34 as a result of its reflection on the substrate and the like constituting the image sensor 11. When such leakage of light causes generation of charge in the memory part 34 (hereinafter, appropriately referred to as leakage charge), the pixel signal can be increased relative to its true value, or the pixel signal can be outputted which is obtained by adding the leakage charge to the charge generated according to the amount of light received by the light receiving part 32.

In order to correct such increase of the pixel signal due to the leakage charge, the image sensor 11 is configured to include a correction pixel for correcting the leakage charge.

Figures 2A, 2B:
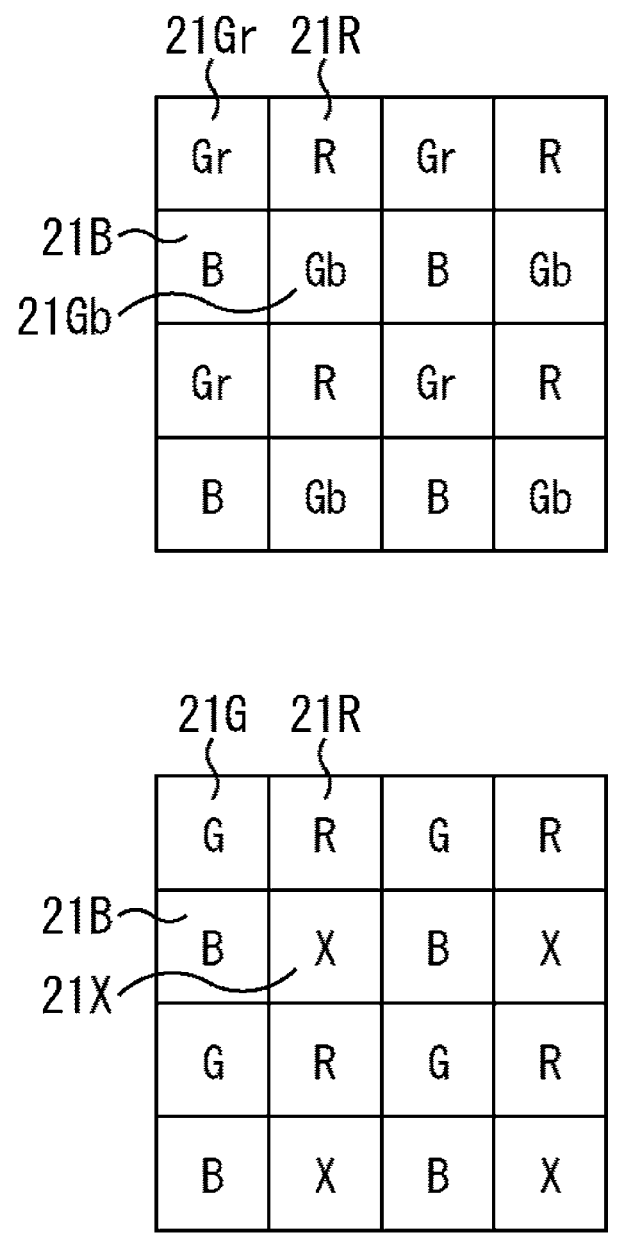

A planar layout of the pixel array 12 having correction pixels with reference to FIGS. 2A and 2B is described.

A typically used layout of pixels 21 in a Bayer pattern is illustrated in FIG. 2A. The Bayer pattern employs a layout in which combinations of four pixels 21 including a red pixel 21R, a blue pixel 21B and two green pixels 21Gr and 21Gb are arranged periodically.

On the contrary, the image sensor 11 employs a layout in which combinations of four pixels 21 including a red pixel 21R, a blue pixel 21B, a green pixel 21G and a correction pixel 21X for correction are arranged periodically.

The correction pixel 21X outputs a pixel signal at the level corresponding to a leakage charge, and the pixel signal outputted from the correction pixel 21X is used as a correction pixel signal for correcting leakage charges included in pixel signals from the other pixels 21. For example, a correction processing part provided downstream of the image sensor 11 (for example, correction processing part 107 in FIG. 15 described later) performs correction processing. The correction processing part corrects increase of the pixel signals due to the leakage charges by subtracting the correction pixel signal outputted from the correction pixel 21X from the pixel signals outputted from the red pixel 21R, blue pixel 21B and green pixel 21G.

Incidentally, the image sensor 11 can employ a shared pixel structure in which a plurality of pixels 21 share the FD 36, amplification transistor 37, selection transistor 38 and reset transistor 39 in order to expand areas of the light receiving parts 32 of the pixels 21.

Figure 3:
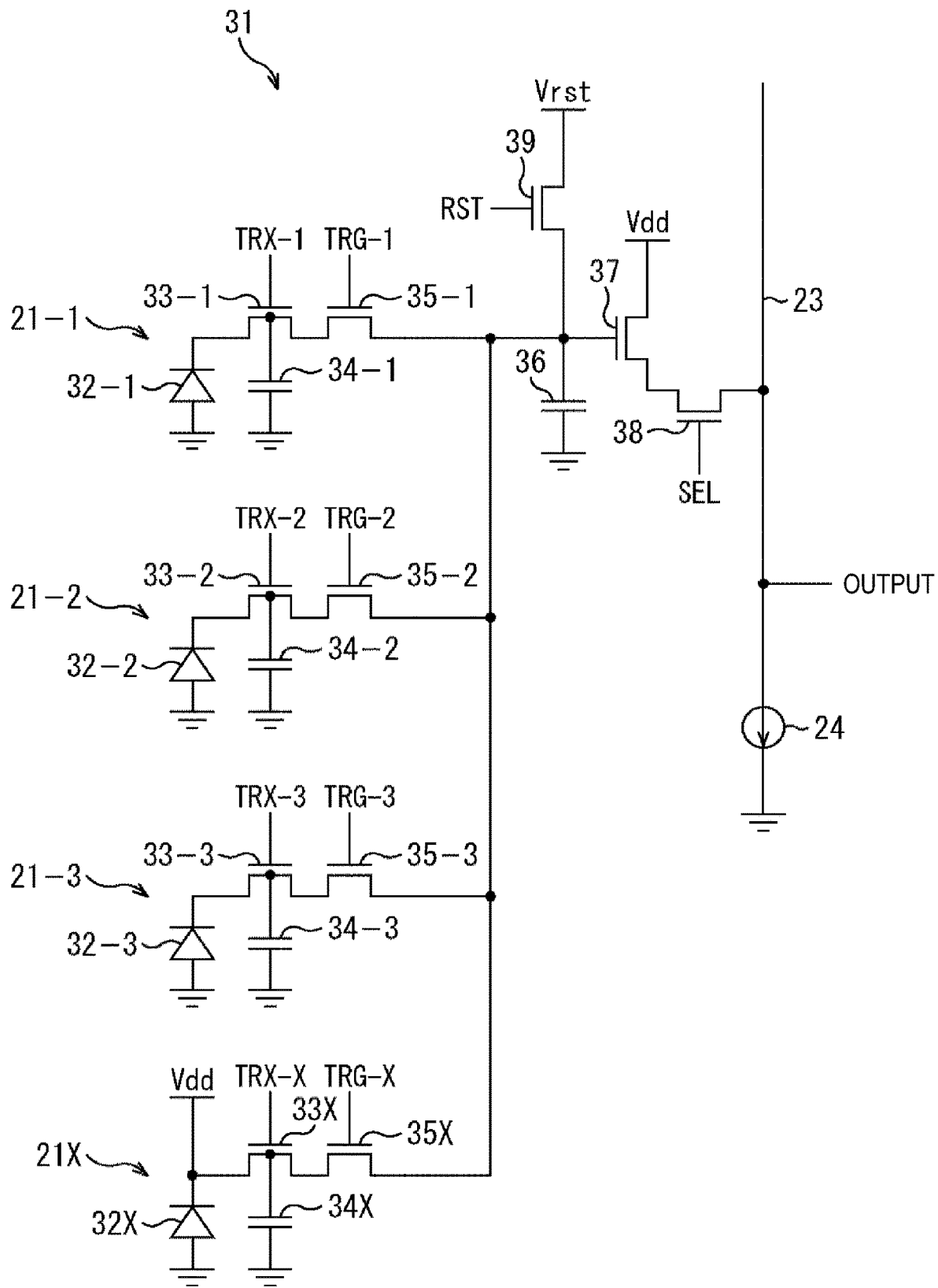
FIG. 3 is a circuit diagram illustrating a first exemplary configuration of a shared pixel unit having a correction pixel.

For example, FIG. 3 illustrates a circuit diagram indicating a first exemplary configuration of a shared pixel unit of a shared pixel structure including four pixels of three pixels 21-1 to 21-3 and a correction pixel 21X.

As illustrated in FIG. 3, in the shared pixel unit 31, the pixels 21-1 to 21-3 and correction pixel 21X share the FD 36, amplification transistor 37, selection transistor 38 and reset transistor 39. Moreover, a constant current source 24 connected to the vertical signal line 23 constitutes a source follower circuit in combination of the amplification transistor 37.

The pixels 21-1 to 21-3 include light receiving parts 32-1 to 32-3, first transfer transistors 33-1 to 33-3, memory parts 34-1 to 34-3 and second transfer transistors 35-1 to 35-3, respectively. Moreover, the correction pixel 21X includes a light receiving part 32X, a first transfer transistor 33X, a memory part 34X and a second transfer transistor 35X.

Herein, the pixels 21-1 to 21-3 are configured similarly to the pixel 21 described with reference to FIG. 1. For example, when the first transfer transistors 33-1 to 33-3 are turned on simultaneously according to transfer signals TRX-1 to TRX-3, charges generated in the light receiving parts 32-1 to 32-3 are collectively transferred to the memory parts 34-1 to 34-3. Moreover, when the second transfer transistors 35-1 to 35-3 are turned on at respective time points according to transfer signals TRG-1 to TRG-3, the charges held in the memory parts 34-1 to 34-3 are sequentially transferred to the FD 36.

On the other hand, the correction pixel 21X is grounded at one terminal of the light receiving part 32X (anode), and meanwhile, is connected to a power supply potential Vdd at the other terminal of the light receiving part 32X (cathode). The charge generated in the light receiving part 32X is normally discharged to the power supply potential Vdd. Moreover, in the correction pixel 21X, a transfer signal TRX-X supplied to the gate electrode of the first transfer transistor 33X is normally fixed to the low level. Accordingly, in the correction pixel 21X, the charge generated in the light receiving part 32X is not transferred to the memory part 34X, and only the leakage charge generated in the memory part 34X is transferred to the FD 36 when the second transfer transistor 35X is turned on according to a transfer signal TRG-X.

Namely, while the pixels 21-1 to 21-3 output the pixel signals at the levels corresponding to the amounts of light received by the light receiving parts 32-1 to 32-3, the correction pixel 21X outputs the pixel signal at the level corresponding to the leakage charge generated in the memory part 34X.

Thus, the image sensor 11 which employs the shared pixel structure based on the shared pixel units 31 can reduce areas occupied, for example, by the amplification transistor 37, selection transistor 38 and reset transistor 39. Thereby, areas of the light receiving parts 32-1 to 32-3 can be expanded relatively. Resulting increase of the amount of saturated charge in the light receiving parts 32-1 to 32-3 can improve signal characteristics of the pixel signals outputted from the pixels 21-1 to 21-3.

Moreover, in the image sensor 11, the correction pixel 21X is configured to transfer only the leakage charge generated in the memory part 34X to the FD 36, and the pixel signal outputted from the correction pixel 21X can be used as a correction pixel signal. Thereby, increase of the pixel signals due to the leakage charges generated in the memory parts 34-1 to 34-3 of the pixels 21-1 to 21-3 can be corrected, and the pixel signals can be acquired more accurately.

In addition, in the case that the pixels 21-1 to 21-3 are not necessarily distinguished individually, they are hereinafter referred to as pixels 21 appropriately. Moreover, this is also applied to the light receiving parts 32-1 to 32-3, first transfer transistors 33-1 to 33-3, memory parts 34-1 to 34-3 and second transfer transistors 35-1 to 35-3 similarly.

Figure 4:
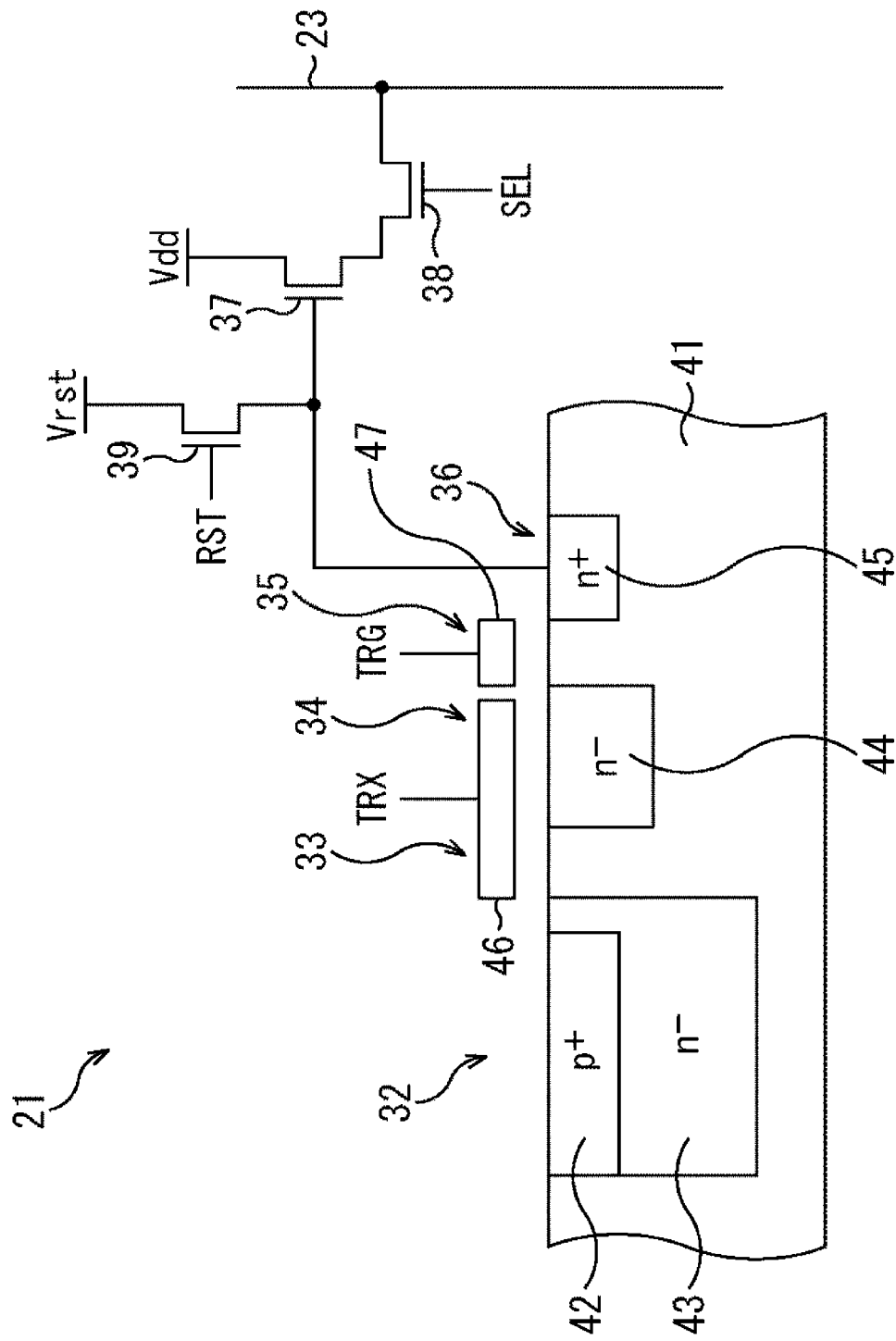
FIG. 4 is a diagram illustrating an exemplary configuration as to a cross section of a pixel.

Next, FIG. 4 is a diagram illustrating an exemplary configuration as to a cross section of the pixel 21.

As illustrated in FIG. 4, the pixel 21 has a p-type region 42 and n-type regions 43 to 45, these formed in a semiconductor substrate 41 formed of a p-well in which a P-type impurity with high concentration is implanted, and has gate electrodes 46 and 47, these formed via a not-shown insulation film on the surface of the semiconductor substrate 41.

The light receiving part 32 is configured of a pn junction formed of the p-type region 42 with high concentration and the n-type region 43 with low concentration. The memory part 34 is configured of the n-type region 44 with low concentration formed in the portion apart from the light receiving part 32 by a predetermined distance. Moreover, the FD 36 is configured of the n-type region 45 with high concentration formed in the portion apart from the memory part 34 by a predetermined distance.

The gate electrode 46 constitutes the first transfer transistor 33, and is disposed to cover the region between the light receiving part 32 and memory part 34 and the memory part 34. In addition, the gate electrode 46 is formed of material with a light shielding property, and shields the memory part 34 from light. Moreover, the gate electrode 47 constitutes the second transfer transistor 35, and is disposed to cover the region between the memory part 34 and FD 36.

Moreover, the FD 36 is connected to the gate electrode of the amplification transistor 37 (gate electrode 62 in FIG. 5) via a wiring.

Figure 5:
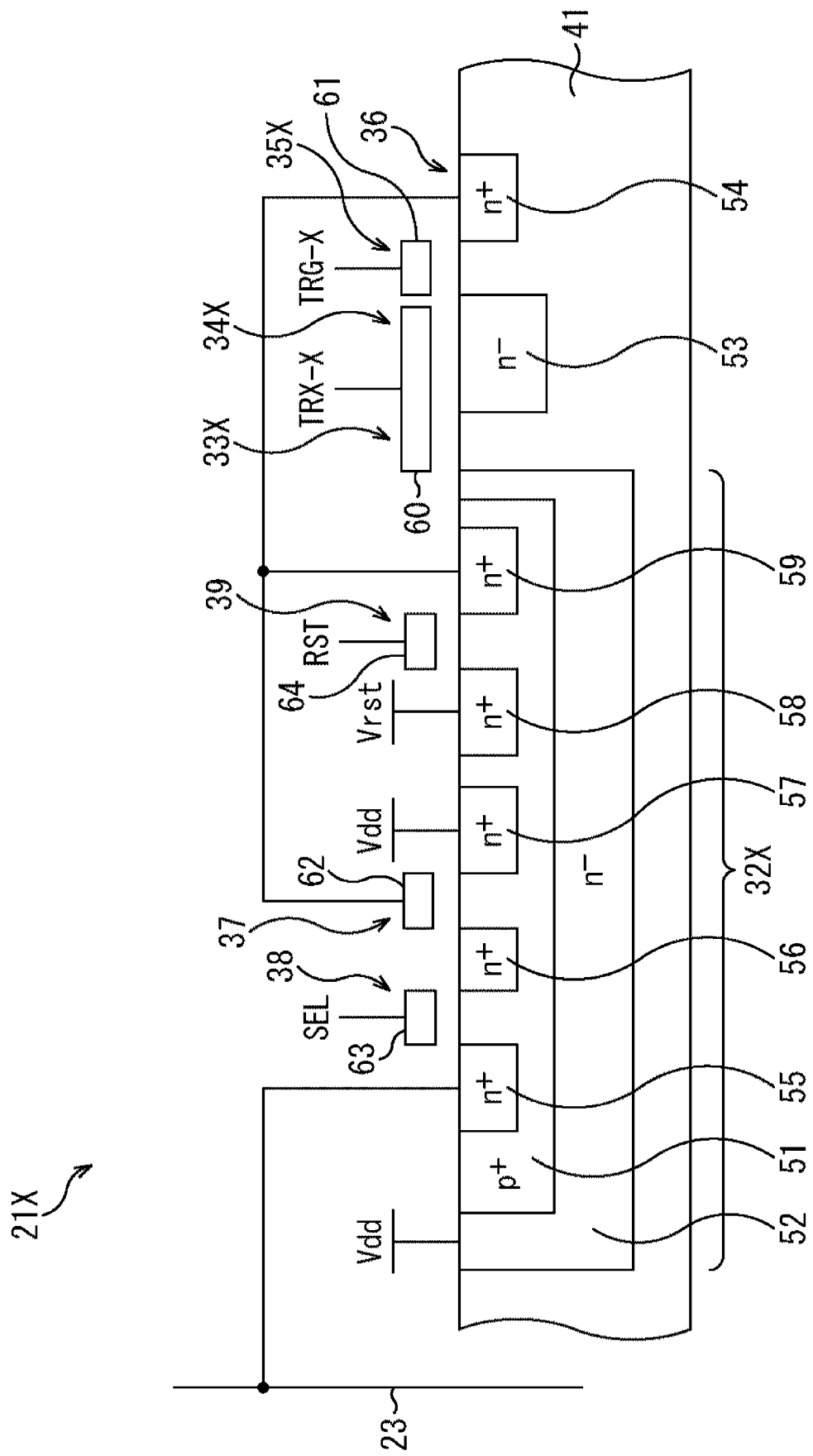
FIG. 5 is a diagram illustrating an exemplary configuration as to a cross section of a correction pixel.

Next, FIG. 5 is a diagram illustrating an exemplary configuration as to a cross section of the correction pixel 21X.

As illustrated in FIG. 5, the correction pixel 21X is formed in the semiconductor substrate 41 similarly to the pixel 21. However, the amplification transistor 37, selection transistor 38 and reset transistor 39 are formed in the top surface of the light receiving part 32X of the correction pixel 21X.

Namely, the correction pixel 21X has a p-type region 51 with high concentration and an n-type region 52 with low concentration which constitute the light receiving part 32X, an n-type region 53 with low concentration constituting the memory part 34X, and an n-type region 54 with high concentration constituting the FD 36, all formed in the semiconductor substrate 41. Furthermore, the correction pixel 21X has n-type regions 55 to 59 with high concentration, these formed in the p-type region 51, and gate electrodes 60 to 64, these formed on the surface of the semiconductor substrate 41 via a not-shown insulation film. Moreover, the power supply potential Vdd is connected to the n-type region 52.

The gate electrode 60 constitutes the first transfer transistor 33X, and is disposed to cover the region between the light receiving part 32X and memory part 34X and the memory part 34X. Moreover, the gate electrode 61 constitutes the second transfer transistor 35X, and is disposed to cover the region between the memory part 34X and FD 36.

The gate electrode 62 constitutes the amplification transistor 37, and is disposed to cover the region between the n-type region 56 and n-type region 57. The power supply potential Vdd is connected to the n-type region 57. Moreover, the n-type region 54 constituting the FD 36 and the n-type region 59 are connected to the gate electrode 62 via a wiring.

The gate electrode 63 constitutes the selection transistor 38, and is disposed to cover the region between the n-type region 55 and n-type region 56. The vertical signal line 23 is connected to the n-type region 55.

The gate electrode 64 constitutes the reset transistor 39, and is disposed to cover the region between the n-type region 58 and n-type region 59. The n-type region 59 is connected to the FD 36 and the gate electrode 62 of the amplification transistor 37 via a wiring. The n-type region 58 is connected to the reset potential Vrst.

Thus, the image sensor 11 has the amplification transistor 37, selection transistor 38 and reset transistor 39, these formed in the light receiving part 32X of the correction pixel 21X. Thereby, the areas of the light receiving parts 32-1 to 32-3 can be expanded up to their maximum. As mentioned above, in the shared pixel unit 31, the pixels 21-1 to 21-3 and correction pixel 21X share the FD 36, amplification transistor 37, selection transistor 38 and reset transistor 39. Furthermore, forming these transistors in the light receiving part 32X of the correction pixel 21X can reduce areas occupied by these transistors, and therefore, can expand the areas of the light receiving parts 32-1 to 32-3 relatively.

Next, operations of the shared pixel unit 31 are described with reference to FIG. 6.

In the shared pixel unit 31, the pixels 21-1 to 21-3 and correction pixel 21X are driven in the order of a charge discharging period, an exposure accumulation period, a charge transfer period and a signal readout period.

At first, during the charge discharging period, charges are discharged simultaneously for a plurality of rows. Namely, the reset signal RST, transfer signals TRX-1 to TRX-3, transfer signals TRG-1 to TRG-3 and transfer signal TRG-X are simultaneously set to the high level. Thereby, charges accumulated in the light receiving parts 32-1 to 32-3, memory parts 34-1 to 34-3, memory part 34X and FD 36 are discharged to the reset potential Vrst via the reset transistor 39. After that, the transfer signals TRX-1 to TRX-3, transfer signals TRG-1 to TRG-3 and transfer signal TRG-X are sequentially set to the low level.

Next, during the exposure accumulation period, the pixels 21-1 to 21-3 generate charges by the light receiving parts 32-1 to 32-3 performing photoelectric conversion, and accumulate the charges corresponding to the respective amounts of light received. In addition, as mentioned above, since the light receiving part 32X is connected to the power supply potential Vdd, the correction pixel 21X does not accumulate a charge in the light receiving part 32X.

Then, during the charge transfer period, the reset signal RST, transfer signals TRG-1 to TRG-3 and transfer signal TRG-X are simultaneously set to the high level. Thereby, charges accumulated in the memory parts 34-1 to 34-3, memory part 34X and FD 36 are discharged to the reset potential Vrst via the reset transistor 39.

Then, after the transfer signals TRG-1 to TRG-3 and transfer signal TRG-X are set to the low level and the reset signal RST is set to the low level, the transfer signals TRX-1 to TRX-3 are simultaneously set to the high level. Thereby, the charges accumulated in the light receiving parts 32-1 to 32-3 are transferred to the respective memory parts 34-1 to 34-3 simultaneously (at the substantially same time point). After that, setting the transfer signals TRX-1 to TRX-3 to the low level completes the transfer of the charges. In addition, change in potential at a time point t1 before setting the transfer signals TRX-1 to TRX-3 to the high level, at a time point t2 when the transfer signals TRX-1 to TRX-3 are at the high level, and at a time point t3 after setting the transfer signals TRX-1 to TRX-3 to the low level is described later with reference to FIGS. 7A to 7C and FIGS. 8A to 8C.

Herein, while the driving is made simultaneously for a plurality of rows during the charge discharging period and charge transfer period, the driving is made for each row during the signal readout period. Namely, during the signal readout period, the pixel signals are read out in the order of the pixel 21-1, pixel 21-2, pixel 21-3 and correction pixel 21X.

At first, after setting the selection signal SEL to the high level makes the pixel signal ready to be read out, the reset signal RST is set to the high level in a pulse-like manner to reset the FD 36, and during a period X1, the pixel signal at the reset level is read out. After that, setting the transfer signal TRG-1 to the high level in a pulse-like manner allows the charge held in the memory part 34-1 to be transferred to the FD 36, and during a period X2, the pixel signal at the level corresponding to the amount of light received by the light receiving part 32-1 is read out. Then, the selection signal SEL is set to the low level.

Thereby, a difference between the pixel signal at the reset level read out during the period X1 and the pixel signal at the level corresponding to the amount of light received by the light receiving part 32-1, which signal is read out during the period X2, is obtained by the CDS processing in the column processing section 14 in FIG. 1. As a result, it is outputted as the pixel signal of the pixel 21-1 in which the noise component is canceled.

After that, similarly, after setting the selection signal SEL to the high level makes the pixel signal ready to be read out, during a period X3, the pixel signal at the reset level is read out, and during a period X4, the pixel signal at the level corresponding to the amount of light received by the light receiving part 32-2 is read out. Then, the selection signal SEL is set to the low level. Thereby, the pixel signal of the pixel 21-2 in which the noise component is canceled is obtained based on the pixel signal at the reset level read out during the period X3 and the pixel signal at the level corresponding to the amount of light received by the light receiving part 32-2, which signal is read out during the period X4.

Moreover, similarly, after setting the selection signal SEL to the high level makes the pixel signal ready to be read out, during a period X5, the pixel signal at the reset level is read out, and during a period X6, the pixel signal at the level corresponding to the amount of light received by the light receiving part 32-3 is read out. Then, the selection signal SEL is set to the low level. Thereby, the pixel signal of the pixel 21-3 in which the noise component is canceled is obtained based on the pixel signal at the reset level read out during the period X5 and the pixel signal at the level corresponding to the amount of light received by the light receiving part 32-3, which signal is read out during the period X6.

Then, after setting the selection signal SEL to the high level makes the pixel signal ready to be read out, and the pixel signal at the reset level is read out during a period X7, the transfer signal TRG-X is set to the high level in a pulse-like manner. Thereby, the charge held in the memory part 34X is transferred to the FD 36. Herein, the leakage charge as mentioned above is accumulated in the memory part 34X. The pixel signal at the level corresponding to the leakage charge generated in the memory part 34X is read out during a period X8. Thereby, the correction pixel signal used for correction of the leakage charge is obtained based on the pixel signal at the reset level read out during the period X7 and the pixel signal at the level correction to the leakage charge generated in the memory part 34X, which signal is read out during the period X8.

Herein, the leakage charge is described with reference to FIGS. 7A to 7C and FIGS. 8A to 8C.

Figure 7A:
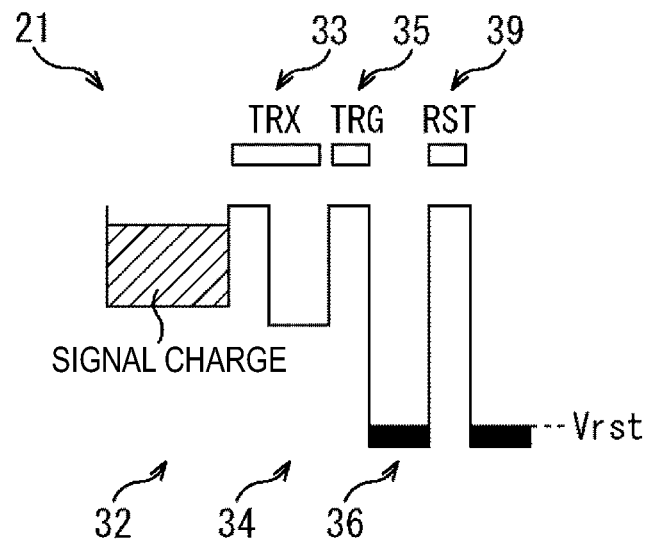
FIGS. 7A to 7C are diagrams illustrating change of the pixel in potential during a charge transfer period.
Figure 7B:
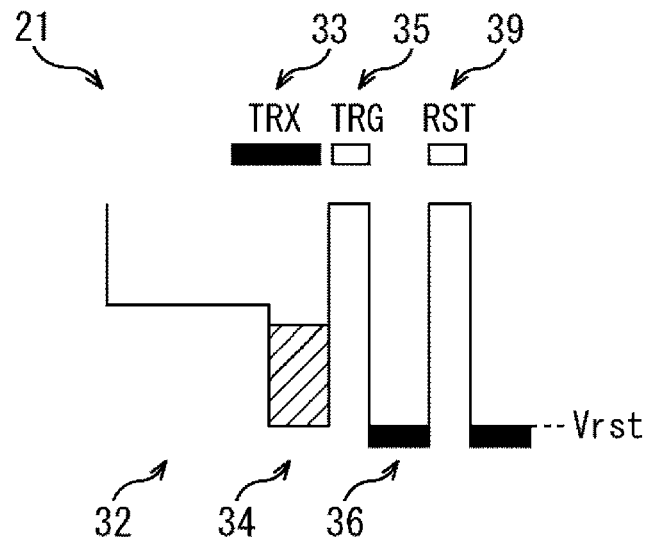
Figure 7C:
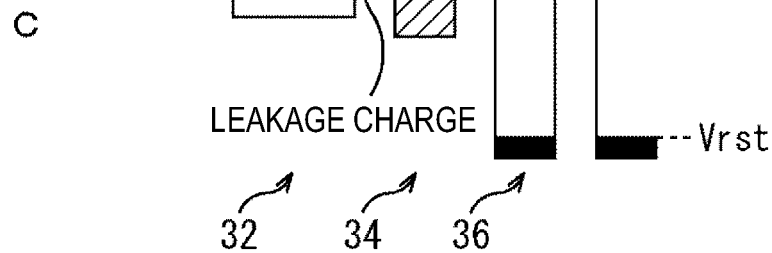
Figure 8A:
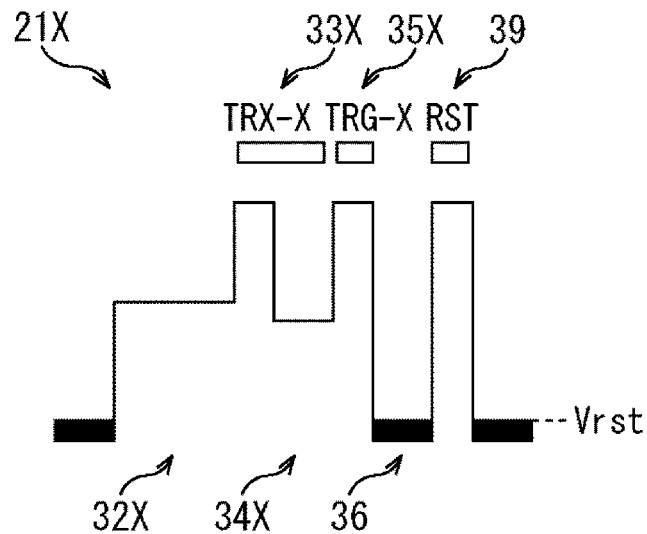
FIGS. 8A to 8C are diagrams illustrating change of the correction pixel in potential during the charge transfer period.
Figure 8B:
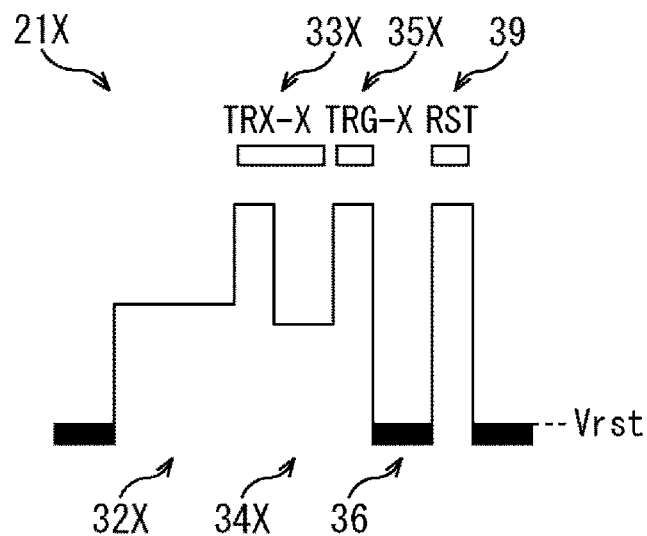
Figure 8C:
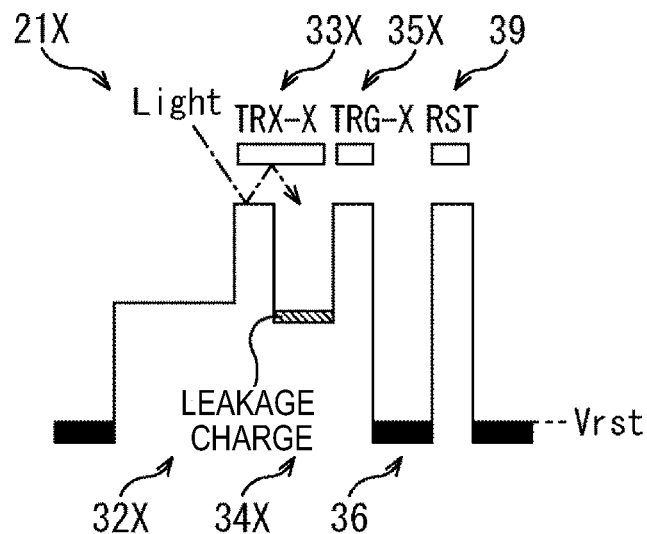

FIGS. 7A to 7C illustrate change in potential of the pixel 21 at the time points t1 to t3 during the charge transfer period. FIGS. 8A to 8C illustrate change in potential of the correction pixel 21X similarly.

Figure 6:
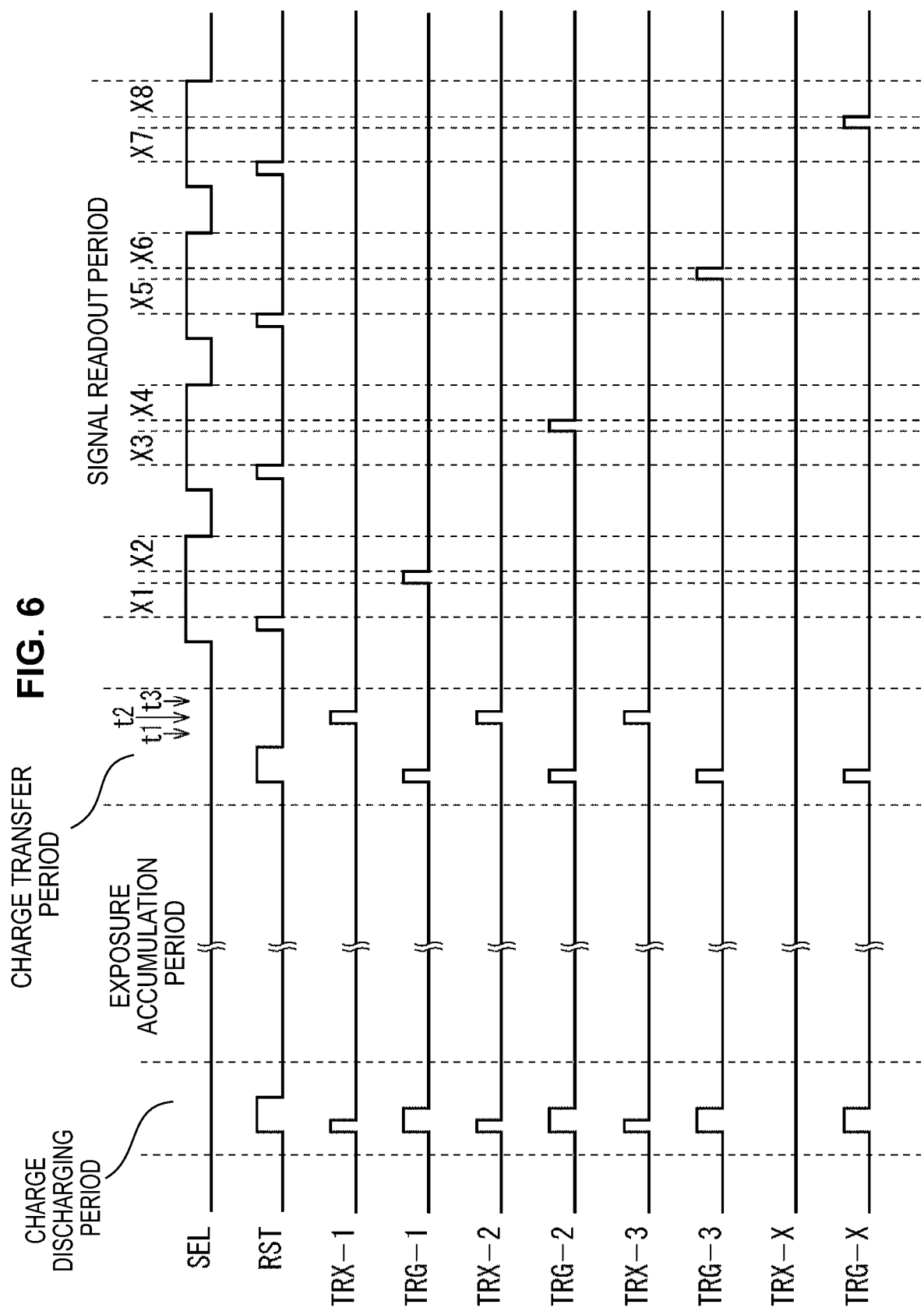
FIG. 6 is a diagram for explaining operations of the shared pixel unit.

As illustrated in FIG. 6, the time point t1 is an arbitrary time point within a period after the reset signal RST is set to the low level and before the transfer signal TRX is set to the high level. The time point t2 is an arbitrary time point within a period when the transfer signal TRX is being set to the high level. The time point t3 is an arbitrary time point immediate after the transfer signal TRX is set to the low level and immediately before, during the signal readout period, the transfer signal TRG is set to the high level.

FIG. 7A illustrates potential of the pixel 21 at time point t1. FIG. 7B illustrates potential of the pixel 21 at time point t2. FIG. 7C illustrates potential of the pixel 21 at time point t3.

Photoelectric conversion in the light receiving part 32 allows a signal charge to be accumulated in the light receiving part 32 as illustrated in FIG. 7A. Then, when the transfer signal TRX is set to the high level, a decline in potential between the light receiving part 32 and memory part 34 and a decline in potential at the memory part 34 causes the signal charge accumulated in the light receiving part 32 to be transferred to the memory part 34 as illustrated in FIG. 7B. After that, the transfer signal TRX set to the low level resumes the potential to the previous status, the memory part 34 holding the signal charge, as illustrated in FIG. 7C. At this stage, when light entering the pixel 21 in an oblique direction reflects on the surface of the semiconductor substrate 41 and the gate electrode 46 of the first transfer transistor 33 and leaks into the memory part 34, the light causes the leakage charge in the memory part 34.

According to this, the pixel signal outputted from the pixel 21 is at the level obtained by adding the leakage charge to the charge generated by the photoelectric conversion in the light receiving part 32.

On the other hand, FIG. 8A illustrates potential of the correction pixel 21X at time point t1. FIG. 8B illustrates potential of the correction pixel 21X at time point t2. FIG. 8C illustrates potential of the correction pixel 21X at time point t3.

Since the light receiving part 32X is connected to the power supply potential Vdd, charge is not being accumulated in the light receiving part 32X as illustrated in FIG. 8A. Moreover, as mentioned above, since the transfer signal TRX-X is normally fixed to the low level, change in potential between the light receiving part 32X and memory part 34X does not arise as illustrated in FIG. 8B. However, when light enters the correction pixel 21X in an oblique direction reflects on the surface of the semiconductor substrate 41 and the gate electrode 60 of the first transfer transistor 33X and leaks into the memory part 34X, the light causes the leakage charge in the memory part 34X as illustrated in FIG. 8C.

According to this, the pixel signal at the level corresponding to the leakage charge is outputted from the correction pixel 21X after the leakage charge is generated in the memory part 34X and the charge is transferred to the FD 36.

Next, a second exemplary configuration of a shared pixel unit having a correction pixel is described with reference to FIG. 9. Incidentally, in FIG. 9, the constituents common to those of the shared pixel unit 31 in FIG. 3 are provided with the respective same reference signs and their detailed description is omitted.

Figure 9:
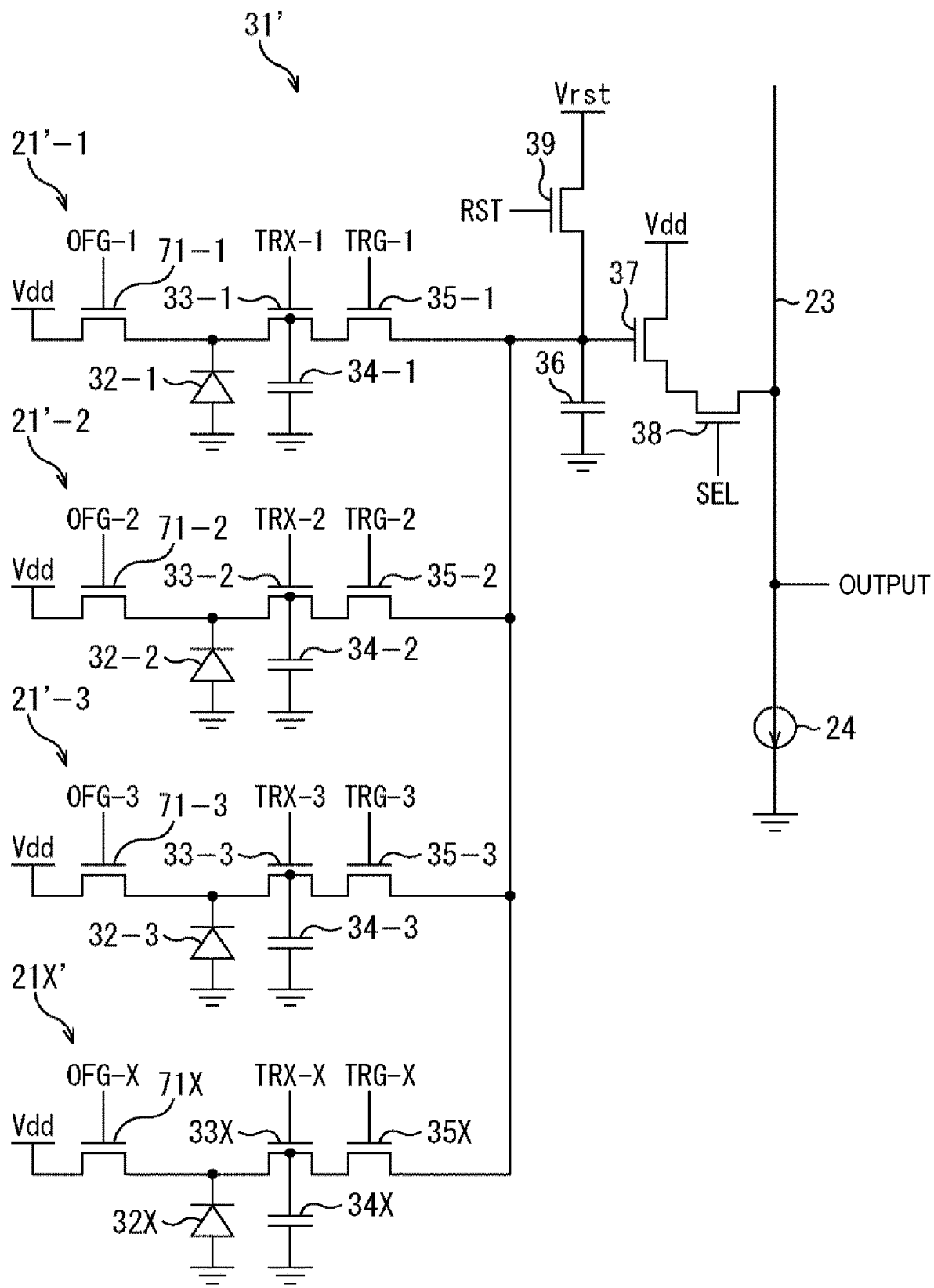
FIG. 9 is a circuit diagram illustrating a second exemplary configuration of a shared pixel unit having a correction pixel.

Namely, as illustrated in FIG. 9, a shared pixel unit 31' has the configuration common to the shared pixel unit 31 in FIG. 3 regarding pixels 21-1' to 21-3' having the light receiving parts 32-1 to 32-3, the first transfer transistors 33-1 to 33-3, the memory parts 34-1 to 34-3 and the second transfer transistors 35-1 to 35-3, respectively, a correction pixel 21X' having the light receiving part 32X, the first transfer transistor 33X, the memory part 34X and the second transfer transistor 35X, and the FD 36, amplification transistor 37, selection transistor 38 and reset transistor 39 which are shared.

However, the shared pixel unit 31' has a configuration different from the shared pixel unit 31 in FIG. 3 regarding charge discharging transistors 71-1 to 71-3 and a charge discharging transistor 71X, being configured to include these.

Namely, as to the shared pixel unit 31', in the pixels 21-1' to 21-3', the light receiving parts 32-1 to 32-3 are connected to the power supply potential Vdd via the charge discharging transistors 71-1 to 71-3, respectively. Moreover, in the correction pixel 21X', the light receiving part 32X is connected to the power supply potential Vdd via the charge discharging transistor 71X.

The charge discharging transistors 71-1 to 71-3 are driven according to charge discharging signals OFG-1 to OFG-3 supplied via the horizontal signal line 22 from the vertical driver 13 in FIG. 1, respectively. Furthermore, when the charge discharging transistors 71-1 to 71-3 are turned on, charges accumulated in the light receiving parts 32-1 to 32-3 are discharged to the power supply potential Vdd to reset the light receiving parts 32-1 to 32-3, respectively. Namely, in contrast to the shared pixel unit 31 in FIG. 3 in which charges in the light receiving parts 32-1 to 32-3 are discharged via the first transfer transistors 33-1 to 33-3 and second transfer transistors 35-1 to 35-3, in the shared pixel unit 31', charges in the light receiving parts 32-1 to 32-3 can be discharged not through the first transfer transistors 33-1 to 33-3 and second transfer transistors 35-1 to 35-3.

Moreover, in the correction pixel 21X', a charge discharging signal OFG-X supplied to the charge discharging transistor 71X is normally fixed to the high level. Accordingly, a charge generated in the light receiving part 32X is normally discharged to the power supply potential Vdd.

Figure 10:
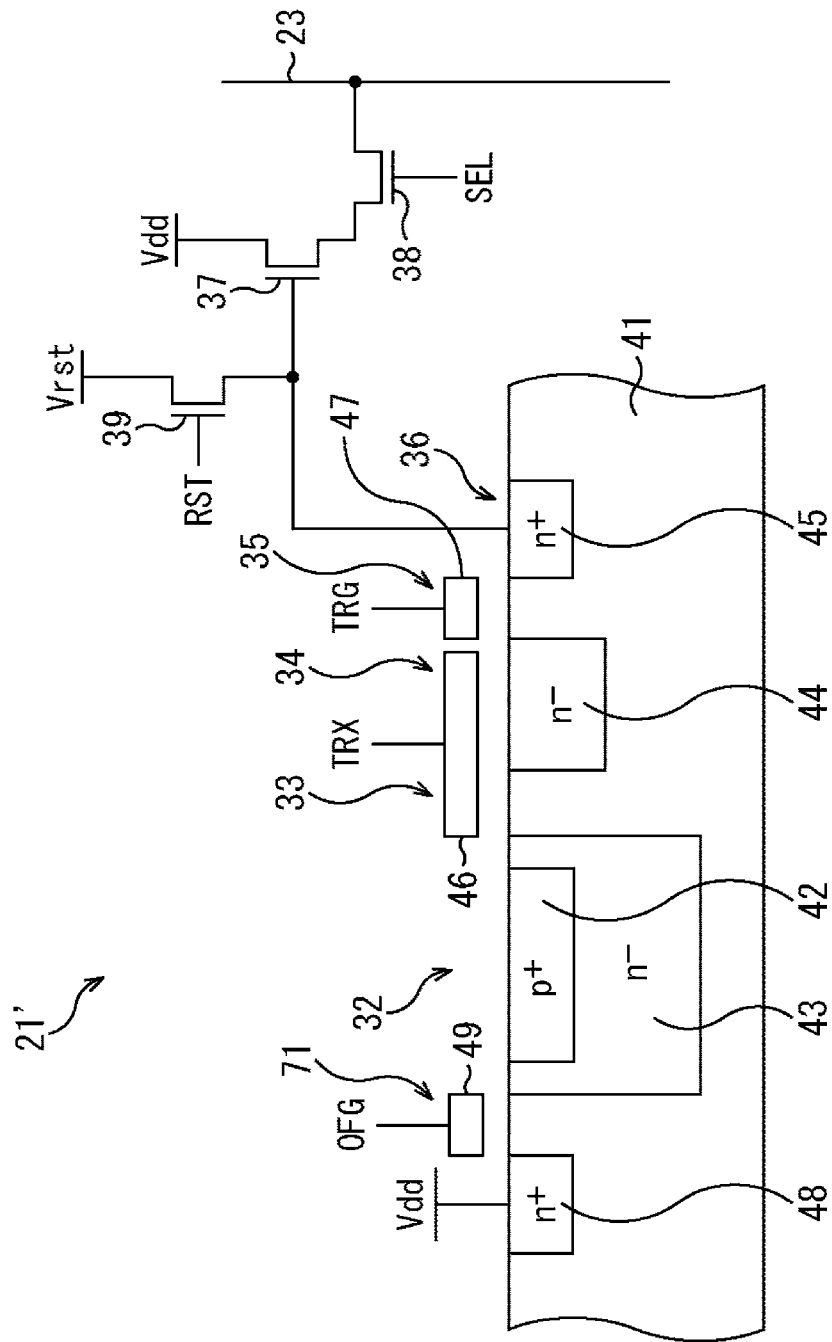
FIG. 10 is a diagram illustrating an exemplary configuration as to a cross section of a pixel.

Next, FIG. 10 is a diagram illustrating an exemplary configuration as to a cross section of the pixel 21'. Incidentally, in FIG. 10, the constituents common to those of the pixel 21 in FIG. 4 are provided with the respective same reference signs and their detailed description is omitted.

Namely, the pixel 21' has the configuration common to the pixel 21 in FIG. 4 regarding the p-type region 42 and n-type regions 43 to 45 formed in the semiconductor substrate 41, and the gate electrodes 46 and 47 formed via a not-shown insulation film on the surface of the semiconductor substrate 41.

However, the pixel 21' has a configuration different from the pixel 21 in FIG. 4 regarding an n-type region 48 with high concentration connected to the power supply potential Vdd and formed in the semiconductor substrate 41, and a gate electrode 49 formed via a not-shown insulation film on the surface of the semiconductor substrate 41.

Namely, the gate electrode 49 constitutes the charge discharging transistor 71, and is disposed to cover the region between the light receiving part 32 and n-type region 48.

The pixel 21' is configured like this, and can discharge a charge accumulated in light receiving part 32 to the power supply potential Vdd to reset the light receiving part 32 according to the charge discharging signal OFG supplied to the charge discharging transistor 71.

Figure 11:
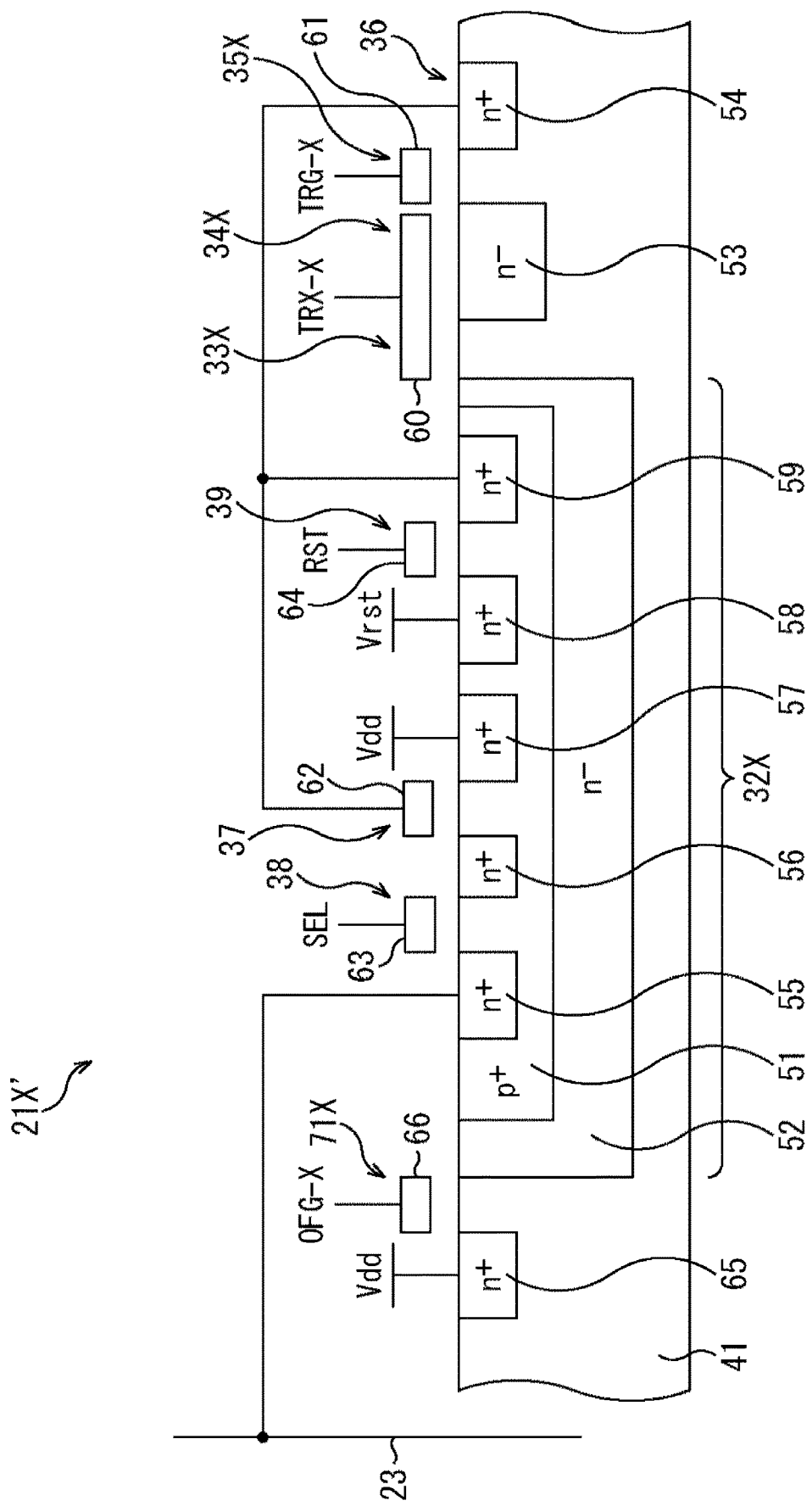
FIG. 11 is a diagram illustrating an exemplary configuration as to a cross section of a correction pixel.

Next, FIG. 11 is a diagram illustrating an exemplary configuration as to a cross section of the correction pixel 21X'. Incidentally, in FIG. 11, the constituents common to those of the correction pixel 21X in FIG. 5 are provided with the respective same reference signs and their detailed description is omitted.

Namely, the correction pixel 21X' has the configuration common to the correction pixel 21X in FIG. 5 regarding the p-type region 51 and n-type regions 52 to 59 formed in the semiconductor substrate 41, and the gate electrodes 60 to 64 formed via a not-shown insulation film on the surface of the semiconductor substrate 41.

However, the correction pixel 21X' has a configuration different from the correction pixel 21X in FIG. 5 regarding an n-type region 65 with high concentration connected to the power supply potential Vdd and formed in the semiconductor substrate 41, and a gate electrode 66 formed via a not-shown insulation film on the surface of the semiconductor substrate 41.

Namely, the gate electrode 66 constitutes the charge discharging transistor 71X, and disposed to cover the region between the light receiving part 32X and n-type region 65.

The correction pixel 21X' is configured like this, and since the charge discharging signal OFG-X supplied to the charge discharging transistor 71X is normally fixed to the high level, a charge generated in the light receiving part 32X is normally discharged to the power supply potential Vdd.

In addition, although not shown, a structure of light shielding for suppressing light leakage into the light receiving part 32X, and thereby, more accurately performing correction using the correction pixel 21X' may be employed.

Next, variations of a planar layout of a pixel array having correction pixels are described with reference to FIGS. 12A to 12C.

As mentioned above with reference to FIGS. 2A and 2B, the image sensor 11 employs a layout in which combinations of four pixels 21 including a red pixel 21R, a blue pixel 21B, a green pixel 21G and a correction pixel 21X for correction are arranged periodically. And, the correction pixel 21X is also configured to receive red light, blue light and green light.

Figure 12A:
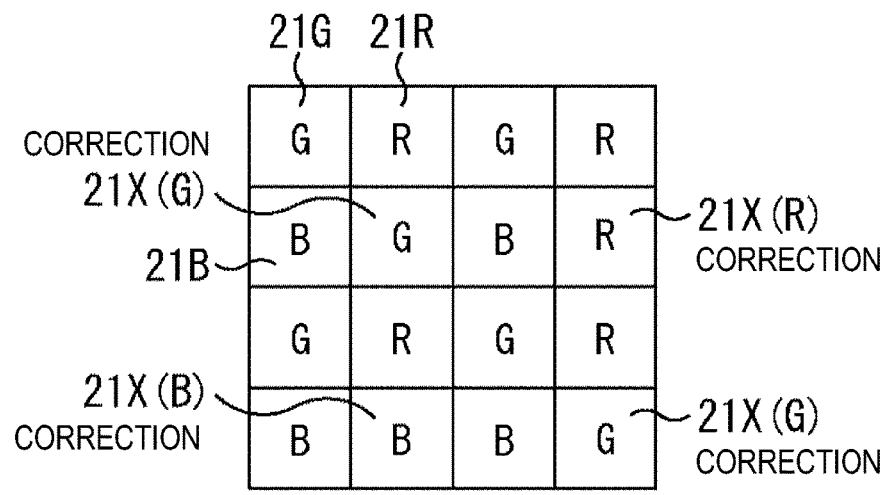
FIGS. 12A to 12C are diagrams illustrating variations of a planar layout of a pixel array having correction pixels.

For example, as illuminated in FIG. 12A, a correction pixel 21X(R) receiving red light, a correction pixel 21X(B) receiving blue light and a correction pixel 21X(G) receiving green light can be arranged. Thereby, as illustrated in the figure, in pixels 21 arranged into 4×4 of columns×rows, a correction pixel signal outputted from the correction pixel 21X(R) can be used for correction of a pixel signal of the pixel 21R. Similarly, a correction pixel signal outputted from the correction pixel 21X(B) can be used for correction of a pixel signal of the pixel 21B, and a correction pixel signal outputted from the correction pixel 21X(G) can be used for correction of a pixel signal of the pixel 21G.

Thus, 4 of 16 pixels 21 are used as correction pixels 21X, these 16 pixels 21 being as one set. Thereby, the correction pixel 21X can be provided for each color of light received by the pixel 21R, pixel 21B and pixel 21G. Thereby, the pixel signal for each color outputted by the pixel 21R, pixel 21B and pixel 21G can be corrected accurately.

Figure 12B:
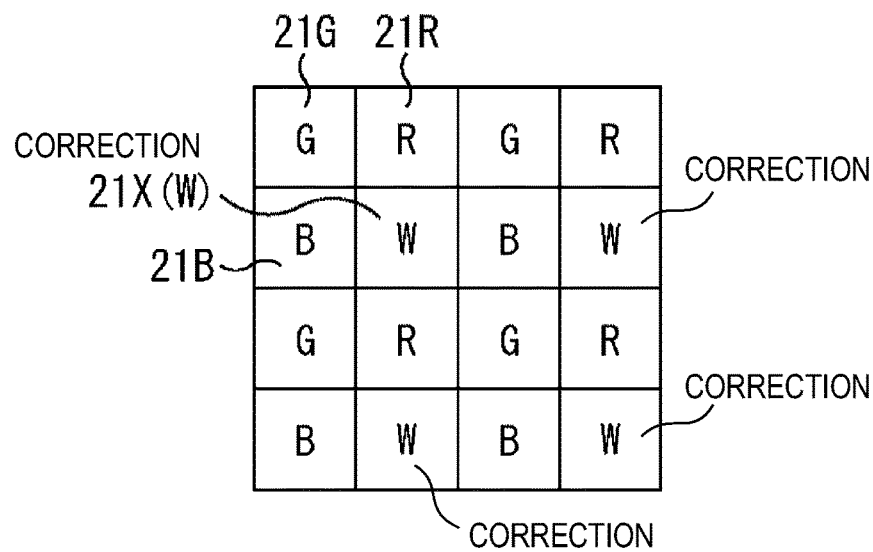

Moreover, as illustrated in FIG. 12B, correction pixels 21X(W) receiving light that does not pass through a color filter, for example, white light can be arranged. Then, by dividing pixel signals of neighboring pixel 21R, pixel 21B and pixel 21G by a given rate corresponding to a correction pixel signal outputted from the correction pixel 21X(W), correction can be performed substantially accurately even if the pixel signal of the correction pixel 21X(W) does not include color information. Especially, since the correction pixel 21X(W) can prevent deterioration of sensitivity caused by the color filter, the leakage charge can be detected in higher accuracy, and thereby, the correction can be performed more accurately.

Figure 12C:
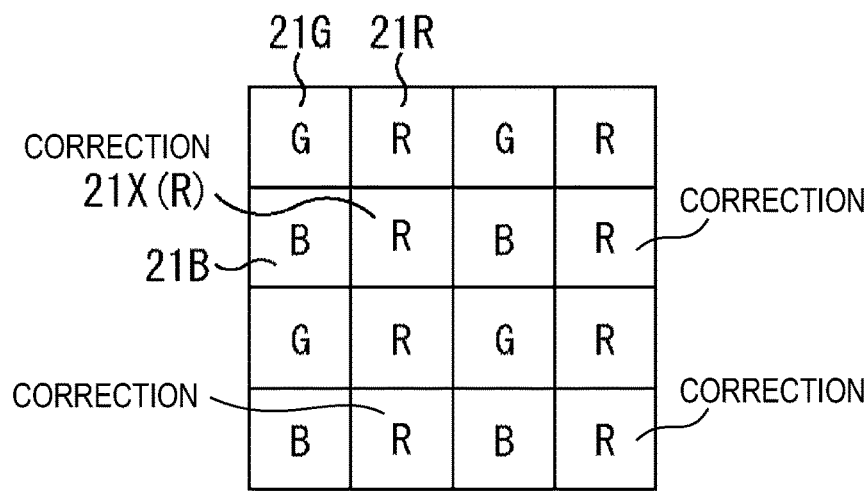

Moreover, as illustrated in FIG. 12C, correction pixels 21X(R) receiving red light can be arranged. For example, in the back-illuminated image sensor, in which light enters a backside opposite to a surface on which a wiring layer is laminated on the semiconductor substrate 41, it is estimated that only the red light reaches the memory part 34 formed in the top surface of the semiconductor substrate 41. Therefore, correction of the pixel signal of the pixel 21R only using the correction pixel signal outputted from the correction pixel 21X(R) can lead to the correction of the leakage charge.

Herein, as illustrated in FIG. 12C, the configuration in which the pixel 21R receiving red light is arranged adjacent to the correction pixel 21X(R) receiving red light can employ a configuration in which the light receiving part 32X of the correction pixel 21X(R) is not connected to the power supply potential Vdd. In other words, by connecting the light receiving part 32X of the correction pixel 21X(R) to the output of the adjacent pixel 21R, a signal charge of the light receiving part 32X can be utilized.

Figure 13:
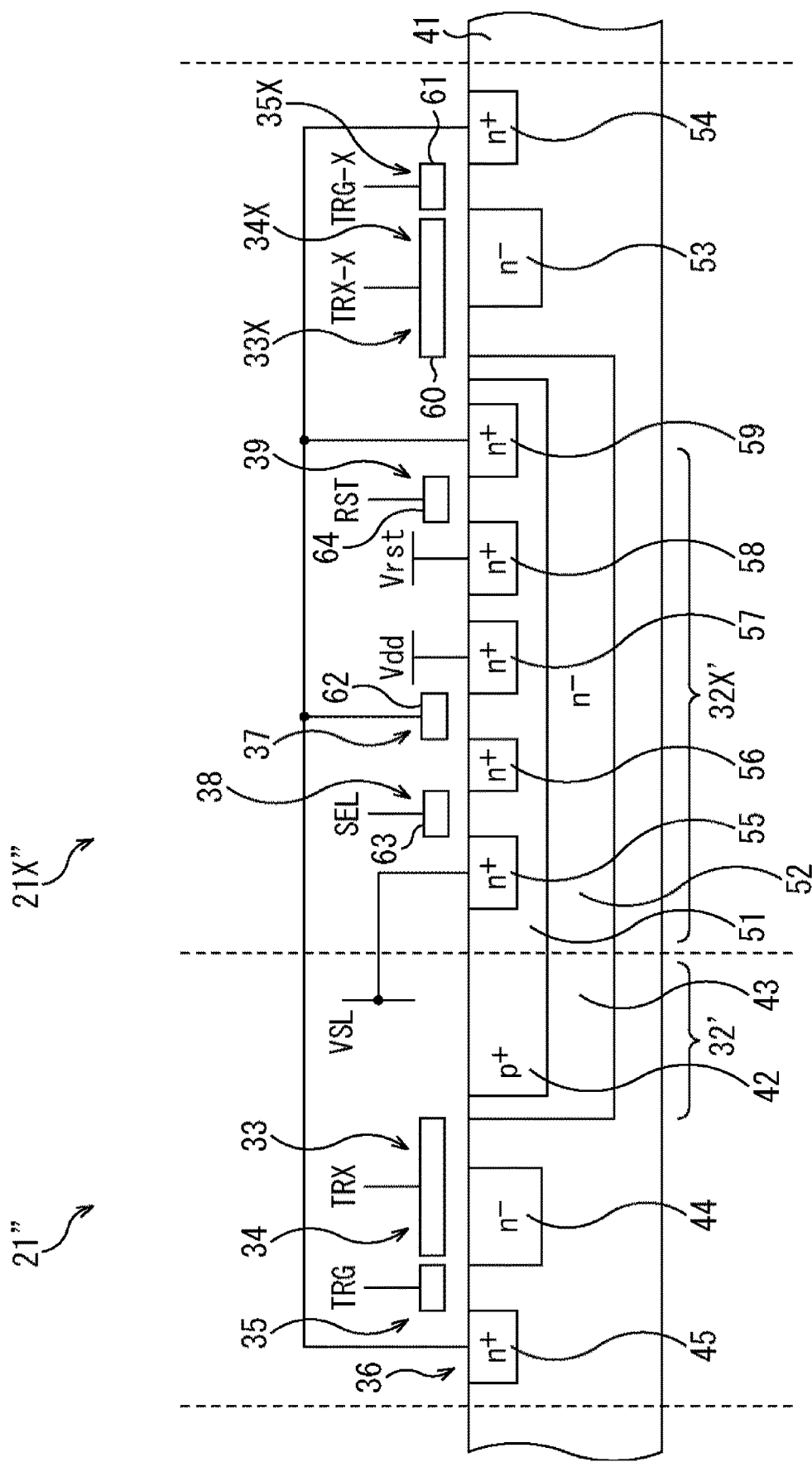
FIG. 13 is a diagram illustrating an exemplary configuration as to a cross section of a variation of a pixel and a correction pixel receiving light of the same color.

Namely, FIG. 13 illustrates a variation of the pixel 21 and correction pixel 21X receiving light of the same color.

As illustrated in FIG. 13, the pixel 21" and correction pixel 21X" have the p-type region 42 and n-type region 43 constituting the light receiving part 32' of the pixel 21", and the p-type region 51 and n-type region 52 constituting the light receiving part 32X' of the correction pixel 21X", all formed integrally. Namely, the p-type region 42 constituting the light receiving part 32' and the p-type region 51 constituting the light receiving part 32X' are formed continuously, and the n-type region 43 constituting the light receiving part 32' and the n-type region 52 constituting the light receiving part 32X' are formed continuously.

By employing such a configuration, a charge generated in the light receiving part 32X' of the correction pixel 21X" is read out as a pixel signal of the pixel 21" along with a charge generated in the light receiving part 32' of the pixel 21". Accordingly, in the configuration in which the pixel 21' and correction pixel 21X" receiving light of the same color are arranged adjacent to each other, sensitivity of the pixel 21" can be improved. Especially, the back-illuminated image sensor is suitable to employ such a configuration.

In addition, in the image sensor 11, as illustrated in FIG. 12C, in addition to the configuration in which the pixel 21R and correction pixel 21X(R) are arranged adjacent to each other, the pixel 21R and correction pixel 21X receiving light of the same color can be arranged adjacent to each other.

Figure 14A:
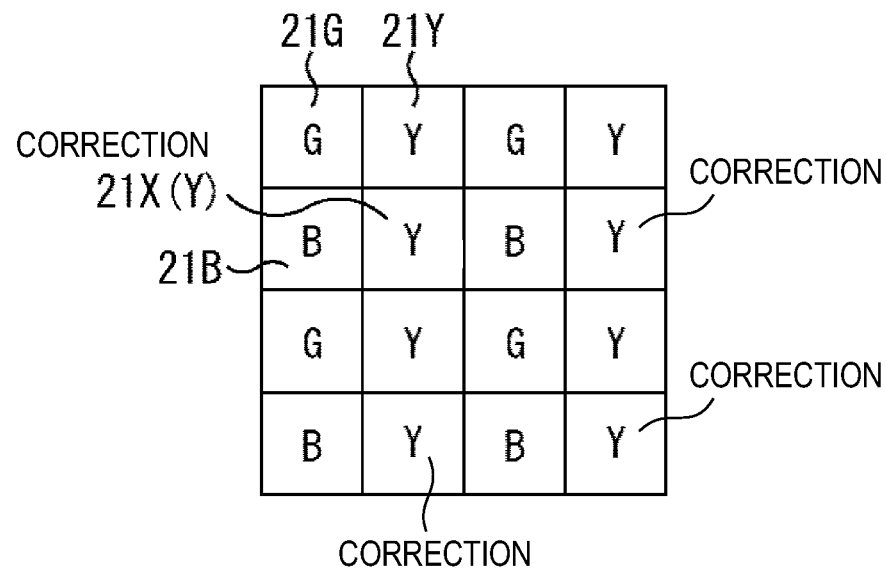
FIGS. 14A and 14B is a diagram illustrating variations of a planar layout of a pixel array having correction pixels.
Figure 14B:
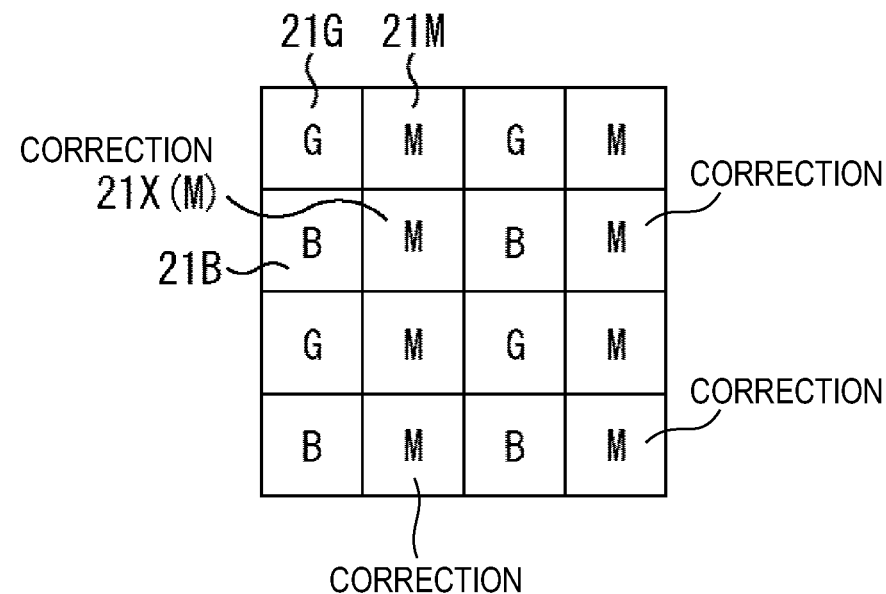

For example, FIG. 14A illustrates a layout in which combinations of a pixel 21B receiving blue light, a pixel 21G receiving green light, a pixel 21Y receiving yellow light and a correction pixel 21X(Y) receiving yellow light are arranged periodically. Moreover, FIG. 14B illustrates a layout in which combinations of a pixel 21B receiving blue light, a pixel 21G receiving green light, a pixel 21M receiving magenta light and a correction pixel 21X(M) receiving magenta light are arranged periodically.

Like this, by arranging the pixel 21 and correction pixel 21X receiving yellow or magenta light adjacent to each other, the configuration as illustrated in FIG. 13 can be employed.

Moreover, the image sensor 11 as mentioned above can be applied to image capturing systems such as a digital still camera and a digital video camera, mobile phones including an image capturing function, or various kinds of electronic apparatuses such as devices including the image capturing function, for example.

Figure 15:
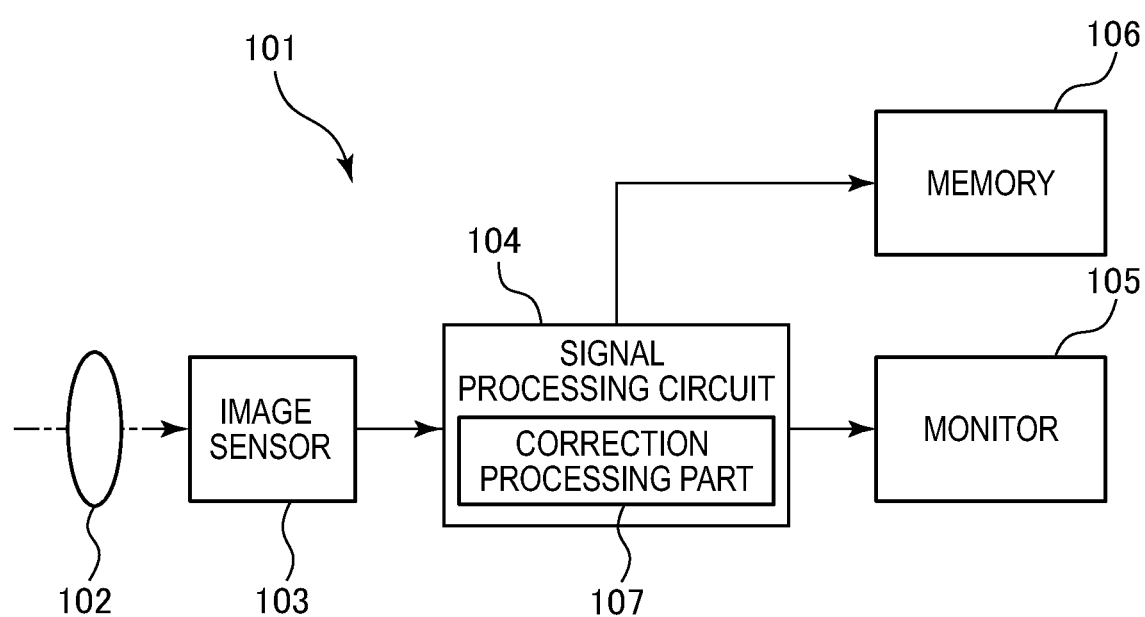
FIG. 15 is a block diagram illustrating an exemplary configuration of an image capturing device built in an electronic apparatus.

FIG. 15 is a block diagram illustrating an exemplary configuration of an image capturing device built in an electronic apparatus.

As illustrated in FIG. 15, an image capturing device 101 is configured to include an optical system 102, an image sensor 103, a signal processing circuit 104, a monitor 105 and a memory 106, and is capable of image capturing of still images and moving images.

The optical system 102 is configured to include on or more lenses, guides image light from the subject (incident light) to the image sensor 103, and images it on a light receiving plane of the image sensor 103 (sensor part).

To the image sensor 103, the image sensor 11 in the above-mentioned exemplary configurations or variations is applied. Electrons are accumulated in the image sensor 103 for a constant period according to an image imaged on the light receiving plane via the optical system 102. Then, signals corresponding to the electrons accumulated in the image sensor 103 are supplied to the signal processing circuit 104.

The signal processing circuit 104 performs various kinds of signal processing on the signal charges outputted from the image sensor 103. Herein, the signal processing circuit 104 has a correction processing part 107, and the correction processing part 107 performs correction processing of correcting increase of the pixel signals due to the leakage charges. Namely, the correction processing part 107 performs processing of subtracting the correction pixel signal outputted from the correction pixel 21X from the pixel signal outputted from the pixel 21 other than the correction pixel 21X (normal pixel), and corrects the component of the leakage charge included in the pixel signal of the pixel 21.

The image (image data) obtained by the signal processing circuit 104 performing the signal processing is supplied to the monitor 105 to be displayed or supplied to the memory 106 to be stored (recorded).

In the image capturing device 101 as configured like this, the image sensor 11 in the above-mentioned exemplary configurations or variations is applied to the image sensor 103. Thereby, images with high quality whose deterioration caused by leakage charges is prevented can be obtained.

Incidentally, in the embodiments, the usage of one of 4 pixels 21 as a correction pixel 21X is described, these 4 pixels 21 being as one set, whereas part of one or more of four or more pixels 21 may be used as correction pixels 21X, these pixels 21 being as one set.

Additionally, the present technology may also be configured as below.

(1) A solid-state image sensor including:
pixels each at least including
light receiving parts receiving light to generate charge,
a transfer part transferring the charge accumulated in the light receiving parts, and
memory parts holding the charge transferred via the transfer part; and
a predetermined number of elements shared by the plurality of pixels, the predetermined number of elements being for outputting a pixel signal at a level corresponding to the charge, wherein
one or some of the plurality of pixels is/are a correction pixel(s) outputting a correction pixel signal used for correcting a pixel signal outputted from pixels other than the one or some of the plurality of pixels, and
the one or some of the predetermined number of elements is/are formed on a wiring layer side of the light receiving parts included in the correction pixel(s).

(2) The solid-state image sensor according to (1), wherein
the transfer part transfers the charge accumulated in the light receiving parts to the memory parts at a substantially same time point for the plurality of pixels.

(3) The solid-state image sensor according to (1) or (2), wherein
the light received by the light receiving parts enters a backside opposite to a surface on which a wiring layer is laminated in a semiconductor substrate in which the light receiving parts are formed.

(4) The solid-state image sensor according to any one of (1) to (3), wherein
a normal pixel other than the correction pixel(s) out of the plurality of pixels receives light of a corresponding color, and
the correction pixel(s) is/are provided for each color of the light received by the normal pixel.

(5) The solid-state image sensor according to any one of (1) to (3), wherein
the correction pixel(s) receives light that does not pass through a color filter.

(6) The solid-state image sensor according to (3), wherein
the correction pixel(s) receives red light.

(7) The solid-state image sensor according to any one of (1) to (6), wherein
the light receiving parts of the correction pixel(s) and the light receiving part(s) of the pixel which is disposed adjacent to the correction pixel(s) and receives light of a color same as that of the correction pixel(s) are formed by connecting to each other.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2012-010806 filed in the Japan Patent Office on Jan. 23, 2012, the entire content of which is hereby incorporated by reference.

What is claimed is:

1. An image sensor comprising:
photoelectric conversion part of a semiconductor substrate that extends into a light receiving part of the semiconductor substrate from a surface of the semiconductor substrate, a conductivity-type of the light receiving part is opposite to a conductivity-type of the photoelectric conversion part;
source/drain regions that extend into the photoelectric conversion part from the surface of the semiconductor substrate, the conductivity-type of the photoelectric conversion part is opposite to a conductivity-type of the source/drain regions;
a first channel region of the photoelectric conversion part between a first one of the source/drain regions and a second one of the source/drain regions, the surface of the semiconductor substrate is between a first gate electrode and the first channel region;
a second channel region of the photoelectric conversion part between a third one of the source/drain regions and a fourth one of the source/drain regions, the surface of the semiconductor substrate is between a second gate electrode and the second channel region; and a third channel region of the photoelectric conversion part between the fourth one of the source/drain regions and a fifth one of the source/drain regions, the surface of the semiconductor substrate is between a third gate electrode and the third channel region.

2. An image sensor comprising:

photoelectric conversion part of a semiconductor substrate that extends into a light receiving part of the semiconductor substrate from a surface of the semiconductor substrate, a conductivity-type of the light receiving part is opposite to a conductivity-type of the photoelectric conversion part;

source/drain regions that extend into the photoelectric conversion part from the surface of the semiconductor substrate, the conductivity-type of the photoelectric conversion part is opposite to a conductivity-type of the source/drain regions;

a floating diffusion that extends into a different part of the semiconductor substrate from the surface of the semiconductor substrate, a first one of the source/drain regions is electrically connected directly to the floating diffusion; and a first channel region of the photoelectric conversion part between the first one of the source/drain regions and a second one of the source/drain regions, the surface of the semiconductor substrate is between a first gate electrode and the first channel region.

3. The image sensor according to claim 2, wherein the conductivity-type of the source/drain regions is same as a conductivity-type of the floating diffusion.

4. The image sensor according to claim 2, wherein the conductivity-type of the photoelectric conversion part is same as a conductivity-type of the different part.

5. The image sensor according to claim 2, wherein the light receiving part extends into the semiconductor substrate from the surface of the semiconductor substrate.

6. The image sensor according to claim 2, wherein the photoelectric conversion part is configured to convert light into a signal charge.

7. The image sensor according to claim 2, further comprising:

a memory part of the semiconductor substrate that extends into the different part from the surface of the semiconductor substrate.

8. The image sensor according to claim 7, wherein the conductivity-type of the source/drain regions is same as a conductivity-type of the memory part.

9. The image sensor according to claim 7, further comprising:

a transfer region of the different part between the floating diffusion and the memory part.

10. The image sensor according to claim 9, wherein the surface of the semiconductor substrate is between a transfer gate electrode and the transfer region.

11. The image sensor according to claim 2, further comprising:

a second channel region of the photoelectric conversion part between a third one of the source/drain regions and a fourth one of the source/drain regions, the surface of the semiconductor substrate is between the second channel region and a second gate electrode.

12. The image sensor according to claim 11, wherein the second gate electrode is electrically connected directly to the floating diffusion.

13. The image sensor according to claim 11, wherein the first channel region is between the second channel region and the floating diffusion.

14. The image sensor according to claim 11, wherein the second one of the source/drain regions is between the first channel region and the third one of the source/drain regions.

15. The image sensor according to claim 11, wherein the third one of the source/drain regions is between the second channel region and the second one of the source/drain regions.

16. The image sensor according to claim 11, wherein the third one of the source/drain regions is electrically connected directly to a power supply potential.

17. The image sensor according to claim 16, wherein the light receiving part is electrically connected directly to the power supply potential.

18. The image sensor according to claim 11, further comprising:

a third channel region of the photoelectric conversion part between the fourth one of the source/drain regions and a fifth one of the source/drain regions, the surface of the semiconductor substrate is between a third gate electrode and the third channel region.

19. The image sensor according to claim 18, wherein the fourth one of the source/drain regions is between the second channel region and the third channel region.

* * * * *